(12) United States Patent
Bernard et al.

(10) Patent No.: US 7,145,370 B2
(45) Date of Patent: Dec. 5, 2006

(54) HIGH-VOLTAGE SWITCHES IN SINGLE-WELL CMOS PROCESSES

(75) Inventors: Frédéric J. Bernard, Fuveau (FR); Christopher J. Diorio, Shoreline, WA (US); Troy N. Gilliland, Newcastle, WA (US); Alberto Pesavento, Seattle, WA (US); Kaila G Raby, Redmond, WA (US); Terry D. Hass, Ballwin, MO (US); John D. Hyde, Corvallis, OR (US)

(73) Assignee: Impinj, Inc., Seattle, WA (US)

( * ) Notice: Subject to any disclaimer, the term of this patent is extended or adjusted under 35 U.S.C. 154(b) by 31 days.

(21) Appl. No.: 10/814,867

(22) Filed: Mar. 30, 2004

(65) Prior Publication Data

US 2005/0052201 A1    Mar. 10, 2005

Related U.S. Application Data

(60) Provisional application No. 60/500,460, filed on Sep. 5, 2003.

(51) Int. Cl.
*H03B 1/00* (2006.01)

(52) U.S. Cl. ................................ 327/112; 327/217

(58) Field of Classification Search ............... 327/108, 327/112, 427, 430–431, 434, 436–437, 215, 327/217, 219; 326/83–85, 87
See application file for complete search history.

(56) References Cited

U.S. PATENT DOCUMENTS

| | | | |
|---|---|---|---|
| 4,158,239 A | 6/1979 | Bertin | 365/182 |
| 4,541,073 A | 9/1985 | Brice et al. | 365/156 |
| 4,571,704 A | 2/1986 | Bohac, Jr. | 365/156 |
| 4,758,869 A | 7/1988 | Eitan et al. | 357/23.5 |
| 4,935,702 A | 6/1990 | Mead et al. | 330/9 |
| 5,018,102 A | 5/1991 | Houston | 365/95 |
| 5,068,622 A | 11/1991 | Mead et al. | 330/253 |
| 5,086,331 A | 2/1992 | Hartgring et al. | 357/51 |
| 5,124,568 A | 6/1992 | Chen et al. | 307/243 |
| 5,323,066 A | 6/1994 | Feddeler et al. | 307/272.3 |
| 5,438,542 A | 8/1995 | Atsumi et al. | 365/182 |
| 5,659,498 A | 8/1997 | Pascucci et al. | 365/154 |
| 5,677,917 A | 10/1997 | Wheelus et al. | 371/122.3 |
| 5,729,155 A * | 3/1998 | Kobatake | 326/68 |
| 5,731,716 A | 3/1998 | Pascucci | 326/106 |
| 5,736,764 A | 4/1998 | Chang | 257/318 |
| 5,761,121 A | 6/1998 | Chang | 365/185.14 |
| 5,777,926 A | 7/1998 | Trinh et al. | 365/185.19 |
| 5,801,994 A | 9/1998 | Chang et al. | 365/185.29 |
| 5,825,063 A | 10/1998 | Diorio et al. | 257/316 |
| 5,835,402 A | 11/1998 | Rao et al. | 365/149 |
| 5,841,165 A | 11/1998 | Chang et al. | 257/318 |
| 5,875,126 A | 2/1999 | Minch et al. | 365/185.01 |

(Continued)

FOREIGN PATENT DOCUMENTS

EP        0 326 883        8/1989

(Continued)

OTHER PUBLICATIONS

Invitation to Pay Additional Fees (Partial International Search), Application No. PCT/US 03/31792, date of mailing Apr. 22, 2004.

(Continued)

*Primary Examiner*—My-Trang Nu Ton
(74) *Attorney, Agent, or Firm*—Thelen Reid & Priest LLP; David B. Ritchie

(57) ABSTRACT

Circuits are provided for high-voltage switching in single-well CMOS processes.

99 Claims, 19 Drawing Sheets

U.S. PATENT DOCUMENTS

| | | | | |
|---|---|---|---|---|
| 5,892,712 | A | 4/1999 | Hirose et al. | 365/185.07 |
| 5,898,613 | A | 4/1999 | Diorio et al. | 365/185.03 |
| 5,901,084 | A | 5/1999 | Ohnakado | 365/185.18 |
| 5,912,841 | A | 6/1999 | Kim | 365/185.09 |
| 5,912,842 | A | 6/1999 | Chang et al. | 365/185.11 |
| 5,912,937 | A | 6/1999 | Goetting et al. | 377/67 |
| 5,914,894 | A | 6/1999 | Diorio et al. | 365/185.03 |
| 5,966,329 | A | 10/1999 | Hsu et al. | 365/185.18 |
| 5,982,669 | A | 11/1999 | Kalnitsky et al. | 365/185.28 |
| 5,986,927 | A | 11/1999 | Minch et al. | 365/185.01 |
| 5,990,512 | A | 11/1999 | Diorio et al. | 257/314 |
| 6,055,185 | A | 4/2000 | Kalnitsky et al. | 365/185.18 |
| 6,111,785 | A | 8/2000 | Hirano | 365/185.09 |
| 6,125,053 | A | 9/2000 | Diorio et al. | 365/185.03 |
| 6,137,723 | A | 10/2000 | Bergemont et al. | 365/185.18 |
| 6,141,247 | A | 10/2000 | Roohparvar et al. | 365/185.08 |
| 6,144,581 | A | 11/2000 | Diorio et al. | 365/185.03 |
| 6,214,666 | B1 | 4/2001 | Mehta | 438/257 |
| 6,222,765 | B1 | 4/2001 | Nojima | 365/185.08 |
| 6,320,788 | B1 | 11/2001 | Sansbury et al. | 365/185.1 |
| 6,331,949 | B1 | 12/2001 | Hirano | 365/185.09 |
| 6,363,006 | B1 | 3/2002 | Naffziger et al. | 365/154 |
| 6,363,011 | B1 | 3/2002 | Hirose et al. | 365/185.07 |
| 6,384,451 | B1 | 5/2002 | Caywood | 257/321 |
| 6,452,835 | B1 | 9/2002 | Diorio et al. | 365/185.03 |
| 6,456,992 | B1 | 9/2002 | Shibata et al. | 703/33 |
| 6,469,930 | B1 | 10/2002 | Murray | 365/185.08 |
| 6,477,103 | B1 | 11/2002 | Nguyen et al. | 365/225.7 |
| 6,573,765 | B1 * | 6/2003 | Bales et al. | 327/108 |
| 6,590,825 | B1 | 7/2003 | Tran et al. | 365/225.7 |
| 6,633,188 | B1 * | 10/2003 | Jia et al. | 327/217 |
| 6,654,272 | B1 | 11/2003 | Santin et al. | 365/96 |
| 6,661,278 | B1 | 12/2003 | Gilliland | 327/536 |
| 6,664,909 | B1 | 12/2003 | Hyde et al. | 341/144 |
| 6,693,819 | B1 | 2/2004 | Smith et al. | 365/154 |
| 6,724,657 | B1 | 4/2004 | Shukuri | 365/185.07 |
| 6,741,500 | B1 | 5/2004 | DeShazo et al. | 365/185.28 |
| 6,822,894 | B1 | 11/2004 | Costello et al. | 365/154 |
| 6,845,029 | B1 | 1/2005 | Santin et al. | 365/96 |
| 6,946,892 | B1 * | 9/2005 | Mitarashi | 327/333 |
| 2002/0122331 | A1 | 9/2002 | Santin et al. | 365/185.09 |
| 2003/0123276 | A1 | 7/2003 | Yokozeki | 365/145 |
| 2003/0206437 | A1 | 11/2003 | Diorio et al. | 365/185.03 |
| 2004/0004861 | A1 | 1/2004 | Srinivas et al. | 365/185.21 |
| 2004/0021166 | A1 | 2/2004 | Hyde et al. | 257/314 |
| 2004/0037127 | A1 | 2/2004 | Lindhorst et al. | 365/202 |
| 2004/0052113 | A1 | 3/2004 | Diorio et al. | 365/185.21 |
| 2005/0149896 | A1 | 7/2005 | Madurawe | 716/17 |

FOREIGN PATENT DOCUMENTS

| | | |
|---|---|---|
| EP | 0 336 500 | 10/1989 |
| EP | 0 756 379 A1 | 1/1997 |

OTHER PUBLICATIONS

Declercq, et al., "Design and Optimization of High-Voltage CMOS Devices Compatible with a Standard 5 V CMOS Technology", IEEE Custom Integrated Circuits Conference, 1993, pp. 24.6.1-24.6.4.

Dickson, "On-Chip High-Voltage Generation in MNOS Integrated Circuits Using an, Improved Voltage Multiplier Technique", IEEE Journal of Solid-State Circuits, vol. SC-11, No. 3, Jun. 1976, pp. 374-378.

Witters, et al., "Analysis and Modeling of On-Chip High-Voltage Generator Circuits for Use in EEPROM Circuits", IEEE Journal of Solid-State Circuits, vol. 24, No. 5, Oct. 1989, pp. 1372-1380.

Carley, L. Richard, "Trimming Analog Circuits Using Floating-Gate Analog MOS Memory", IEEE Journal of Solid-State Circuits, vol. 24, No. 6, pp. 1569-1575, Dec. 1989.

Partial International Search for International Application No. PCT/US03/31792, date mailed Apr. 2, 2004.

Raszka, Jaroslav, et al., "Embedded Flash Memory for Security Applications in a 0.13 μm CMOS Logic Process", IEEE 2004 International Solid-State Circuits Conference, Feb. 16, 2004, pp. 46-47.

International Search Report for International Application No. PCT/US05/10434, date of mailing Sep. 13, 2005.

International Search Report for International Application No. PCT/US2005/010432, date of mailing Sep. 27, 2005.

International Search Report for International Application No. PCT/US2005/010431, date of mailing Sep. 27, 2005.

International Search Report for International Application No. PCT/US03/31792, date of mailing Aug. 12, 2004.

* cited by examiner

HIGH-VOLTAGE SWITCHES IN SINGLE-WELL CMOS PROCESSES

STATEMENT OF RELATED APPLICATIONS

This application claims the benefit of U.S. Provisional Patent Application Ser. No. 60/500,460 filed Sep. 5, 2003 and having the same title and inventors and being commonly assigned herewith. This application is also related to U.S. patent application Ser. Nos. 10/813,907, 10/814,866 and 10/814,868 all entitled "Rewriteable Electronic Fuses" and filed on even date herewith, commonly assigned and in the name of inventors Christopher J. Diorio, Frederic Bernard and Todd E. Humes and Alberto Pesavento.

FIELD OF THE INVENTION

The present invention is directed to high-voltage switches implemented in single-well CMOS (complementary metal oxide semiconductor) processes.

BACKGROUND OF THE INVENTION

Certain types of nonvolatile memory devices, circuits employing floating-gate devices, high-voltage drivers and other circuits fabricated in logic CMOS require relatively high voltages (e.g., 10 volts in a 3.3 volt CMOS process). For example, in nonvolatile memory devices high voltages are often used to by circuits that program and erase information stored on the floating gates, and on-chip charge pumps are generally used to generate these high voltages. In all these circuits, switches are required to selectively apply the high voltages to specific circuit elements.

The only silicon structure in generic n-well CMOS processes (where "generic" means that a process lacks specialized structures, such as for high-voltage devices, and n-well is the most common process type in the industry) that can handle voltages significantly greater than the logic supply voltage is an n-well. This limitation means that there are only three types of high-voltage structures that can be built in such a generic n-well CMOS process: (1) an nFET (n-channel Field Effect Transistor) that has, an n-well for its drain and/or source and examples of which include the Lateral-Diffused Metal-Oxide Semiconductor nFET (LD-MOS nFET) and Drain Extended MOS nFET (DEMOS nFET); (2) well resistors or well wires, where the well is used as a conductive element that can tolerate high voltages; and (3) pFETs (p-channel Field Effect Transistors) in an n-well, where the n-well itself can be at a high voltage relative to the substrate. Because a single pFET cannot normally handle drain-to-source voltages much larger than the rated supply voltage for a given process (e.g., not much more than 3.3V for a 3.3V CMOS process), it is common to cascode a plurality of pFETs (i.e., put two or more in series) in one or more n-wells, in order to handle such high voltages. Note that these same three basic devices can be fabricated in p-well CMOS processes, with p replaced by n (and vice versa), and with positive voltages replaced by negative voltages (and vice versa).

Switch circuits which can tolerate a high-voltage supply and can generate and use intermediate voltages, as well as generate high-voltage drive signals from low-voltage logic-gate-level signals, all while minimizing power consumption, are highly desired.

BRIEF DESCRIPTION OF THE INVENTION

Circuits are provided for high-voltage switching in low-voltage CMOS processes. In a first aspect of the invention, a switch circuit for providing a switched high-voltage signal in response to an input logic-level state includes: a first pFET having a source, drain, well and gate terminal, the source and well coupled to a source of a high-voltage signal (the source and well do not have to be coupled to the same source of a high-voltage signal), the drain coupled to an intermediate node and the gate coupled to a control node; a second pFET having a source, drain, well and gate terminal, the source and well coupled to the intermediate node, the drain coupled to a voltage output node and providing the switched high-voltage signal, the gate coupled to a source of a first Intermediate-Voltage, the first Intermediate-Voltage being intermediate the high-voltage and a ground; a diode having its anode coupled to a source of a second Intermediate-Voltage (which may be the first Intermediate-Voltage), the second Intermediate-Voltage being intermediate the High-Voltage and the ground, and its cathode coupled to the intermediate node; and a High-Voltage MOS nFET having a source, drain and gate terminal, the source coupled to the ground, the drain coupled to the voltage output node and the gate coupled to a source of the input logic-level state.

In a second aspect of the invention the high-voltage MOS nFET is cascoded with one or more additional nFETs to reduce the voltage stress on the various circuit components and in that manner a switch circuit for providing a switched high-voltage signal in response to an input logic-level state includes: a first pFET having a source, drain, well and gate terminal, the source and well coupled to a source of a high-voltage signal, the drain coupled to a first intermediate node and the gate coupled to a control node; a second pFET having a source, drain, well and gate terminal, the source and well coupled to the first intermediate node, the drain coupled to a voltage output node and providing the switched high-voltage signal, the gate coupled to a source of a first Intermediate-Voltage, the first Intermediate-Voltage being intermediate the high-voltage and a ground; a first diode having its anode coupled to a source of a second Intermediate-Voltage (which may be the first Intermediate-Voltage), the second Intermediate-Voltage being intermediate the High-Voltage and the ground, and its cathode coupled to the first intermediate node; a MOS nFET having a source, drain and gate terminal, the source coupled to the ground, the drain coupled to a second intermediate node and the gate coupled to a source of the input logic-level state; and a high-voltage MOS nFET having a source, drain and gate terminal, the source coupled to the drain of the MOS nFET, the drain coupled to the voltage output node and the gate coupled to a source of Vdd, the Vdd being a voltage between the Intermediate-Voltages and the ground.

In accordance with various other aspects of the invention: (1) the first and second Intermediate-Voltages may be the same or essentially the same, e.g., sourced from the same voltage supply or from supplies set to provide essentially the same voltages; (2) the high-voltage nFET(s) may comprise a drain region having an n+ region disposed within an n− well in the p− bulk of a semiconductor substrate; (3) various forms of a pull-up circuit may be coupled to the control node to raise it to the high-voltage; (4) a capacitor may be coupled between the control node and a logic-level input node; (5) the various diodes may be formed of nFET MOS devices and/or pFET MOS devices, or they may be n-well diodes, as desired; and (6) the control node may be coupled to a latch-type circuit with or without precharge capability.

In yet another aspect of the present invention a circuit for providing a differential switched high-voltage signal in response to a pair of complementary Reset-Set input logic-level signals, includes: a first and a second pFET each having a source, drain, well and gate terminal, the source and well of each coupled to a source of a high-voltage signal, the drain of the second pFET coupled to a first intermediate node and its gate coupled to a second intermediate node, the drain of the first pFET coupled to the second intermediate node and its gate coupled to the first intermediate node; a first circuit portion responsive to the Set signal and a Preset signal coupled to the first intermediate node to enable assertion of the Set signal to the first intermediate node when the Preset signal is asserted; a second circuit portion responsive to the Reset signal and the Preset signal coupled to the second intermediate node to enable assertion of the Reset signal to the second intermediate node when the Preset signal is asserted; a third and fourth pFET, said third pFET having its source coupled to the first intermediate node, its drain coupled to a first of two complementary switched voltage output nodes and its gate coupled to an intermediate-voltage supply, and said fourth pFET having its source coupled to the second intermediate node, its drain coupled to the second of two complementary switched voltage output nodes and its gate coupled to the intermediate-voltage supply; and a first and a second high-voltage nFET, said first high-voltage nFET having its drain coupled to the first of two complementary switched voltage output nodes, its gate coupled to a Vdd supply, and its source coupled to GND through a first transistor responsive to the Reset signal, said second high-voltage nFET having its drain coupled to the second of two complementary switched voltage output nodes, its gate coupled to the Vdd supply, and its source coupled to GND through a second transistor responsive to the Set signal.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of high-voltage switch circuits implemented in single-well CMOS processes. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the symbol n+ indicates an n-doped semiconductor material typically having a doping level of n-type dopants on the order of $10^{21}$ atoms per cubic centimeter. The symbol n− indicates an n-doped semiconductor material typically having a doping level on the order of $10^{17}$ atoms per cubic centimeter. The symbol p+ indicates a p-doped semiconductor material typically having a doping level of p-type dopants on the order of $10^{21}$ atoms per cubic centimeter. The symbol p− indicates a p-doped semiconductor material typically having a doping level on the order of $10^{17}$ atoms per cubic centimeter. Those of ordinary skill in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skill in the art. Such persons of ordinary skill in the art will now also realize that a range of doping concentrations around those described above will also work. Essentially, any process capable of forming pFETs and nFETs will work. Doped regions may be diffusions or they may be implanted.

Figure 1:
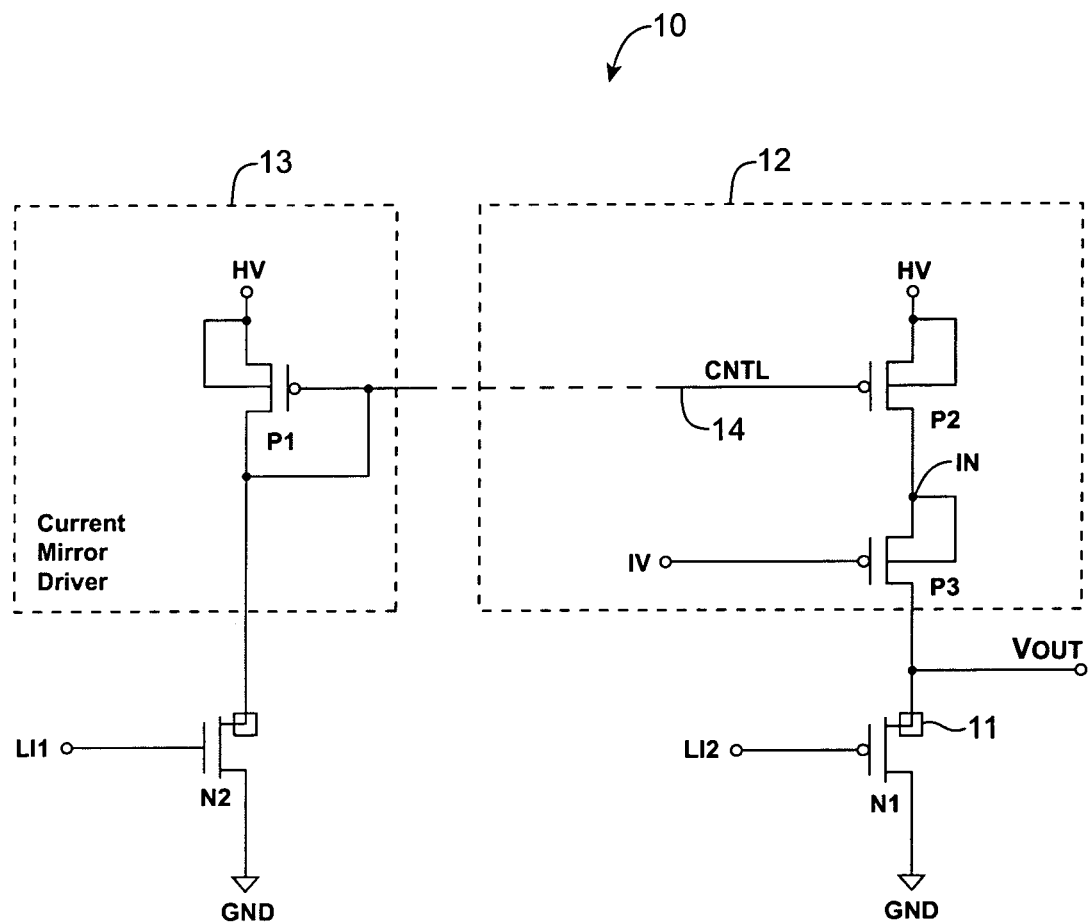
FIG. 1 is an electrical schematic diagram of a high-voltage nFET switch circuit with a cascaded pFET stack on top and a current-mirror driver in accordance with the prior art.

Turning now to the figures, FIG. 1 is an electrical schematic diagram illustrating an electrical switch circuit 10. Circuit 10 includes a high-voltage (capable of handling more than Vdd across its drain-source) nFET N1 which may be of the LDMOS type, DEMOS type or any other suitable type. The circuit symbol for nFET N1 includes a square symbol 11 surrounding the drain of nFET N1 which denotes a drain comprising an n+ region disposed in an n− well for tolerating higher voltages. This symbol will be used throughout this disclosure to indicate a high-voltage nFET. Circuit block 12 is a cascoded pFET stack comprising pFETs P2 and P3 with intermediate node IN disposed between them and coupled to the drain of pFET P2 and the source of pFET P3. Current mirror driver circuit block 13 acts as a pull-up to provide high-voltage source HV to control node 14 (shown as signal CTRL on control node 14).

Circuit 10 operates as follows. Logic input LI1 (working within the voltage range of GND–Vdd) is applied to the gate of high-voltage nFET N2. If LI1 is high then transistor N2 will conduct, if not, it will not. If it conducts, it will pull control node 14 down from a high-voltage causing pFET P2 to conduct from a high-voltage supply HV (which may be the same as the HV supply applied to the source of pFET P1, but it need not be the same). With pFET P2 conducting, intermediate node IN is brought up to HV. The pFET P3 is forced on by Intermediate-Voltage (IV) to form a cascode with pFET P2. Since logic input LI2 is in opposite phase with LI1, when LI1 is high and N2 is conducting, LI2 is low and N1 is not conducting. In this way, Vout is high and provides the output of the high-voltage supply. Switching the state of LI1 and LI2 forces Vout to be low because control node 14 stays high (pulled high by current mirror driver 13) which turns off pFET P2. Since LI2 is now high, Vout is brought to ground (GND) through transistor N1 since it is conducting. Note that throughout this disclosure, where multiple sources of high-voltage (HV) are required, they may be from the same source, or they may be from different sources at different voltage levels, if appropriate and desirable. The same applies for sources of Intermediate-Voltages (which typically have a magnitude between HV and Vdd). Sources of HV or IV may be obtained from conventional charge-pump circuits operating off of the GND–Vdd supply as is well known to those of ordinary skill in the art and are, accordingly, not shown or discussed further herein.

There are some issues with circuit 10. First, the current mirror draws continuous power from the HV supply whenever HV nFET N2 is turned on, which is not desirable for low-power applications. Second, during switching operations, it is possible to see more than HV/2 volts across pFET P3 which may present reliability problems. Accordingly, several embodiments of the present invention involve alternative ways to drive the signal CNTL on the control node 14 of the circuit of FIG. 1 (and modifications thereof). Several embodiments also address the cascoded pFET circuit 12 and ways to modify it to make it more robust.

Figure 2:
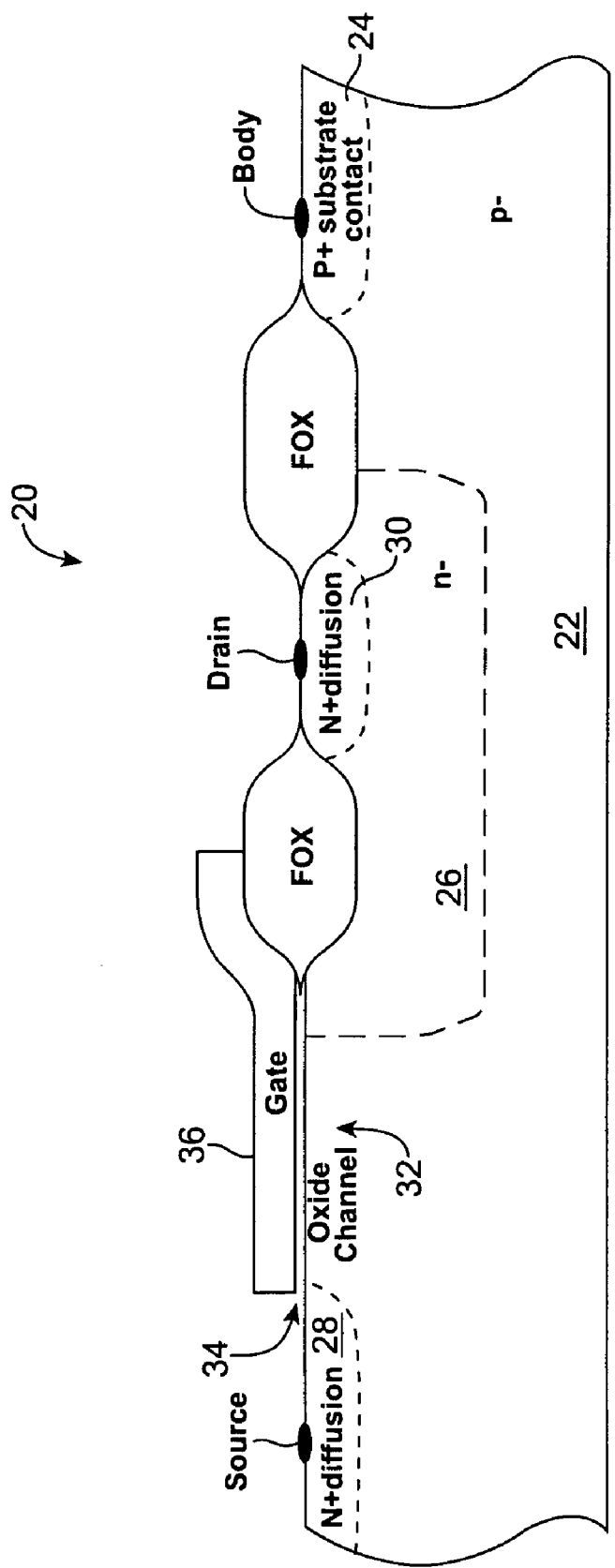
FIG. 2 is a side elevational cross-sectional view of a single high-voltage LDMOS nFET for high-voltage use in accordance with the prior art.

FIG. 2 is a side elevational cross-sectional view of a single high-voltage LDMOS nFET 20 for high-voltage use in accordance with the prior art. Transistor 20 is fabricated on a p− substrate 22 and includes p+ region 24 that provides a substrate contact and a means to ground the substrate 22. A first n− well 26 and a first n+ diffusion 28 are provided. Within first n− well 26 is an n+ region 30 which, together with region 26, serves as the drain of transistor 20. A channel 32 exists between first n− well 26 and first n+ diffusion 28. An insulation layer 34 is provided over channel 32 to insulate a gate 36 from the substrate 22. The insulation layer 34 may be any appropriate insulator as known to those of ordinary skill in the art, such as a gate oxide which may grown or deposited. Gate 36 may comprise highly doped polycrystalline silicon, a metal, or other conductive materials known to those of ordinary skill in the art.

Figure 3:
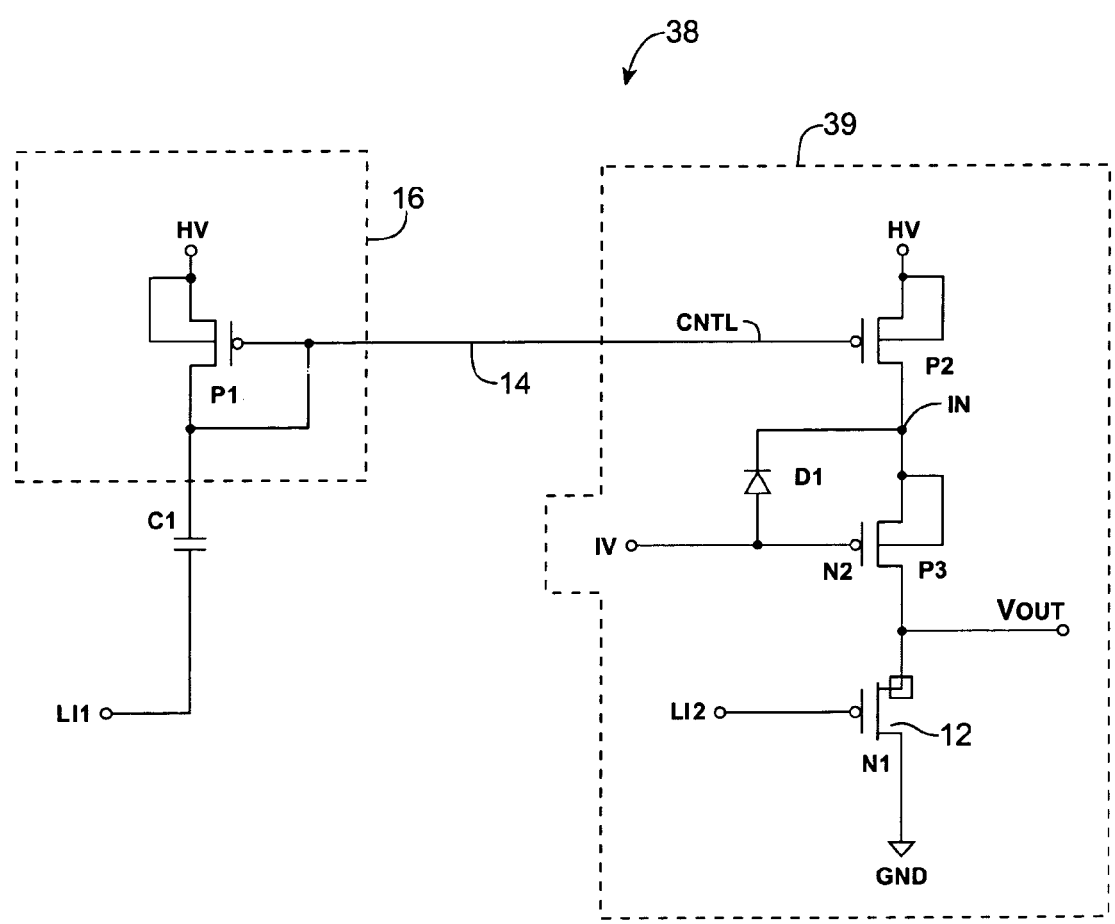
FIG. 3 is an electrical schematic diagram of a first modification of the switch circuit of FIG. 1 in accordance with an embodiment of the present invention.
Figure 7:
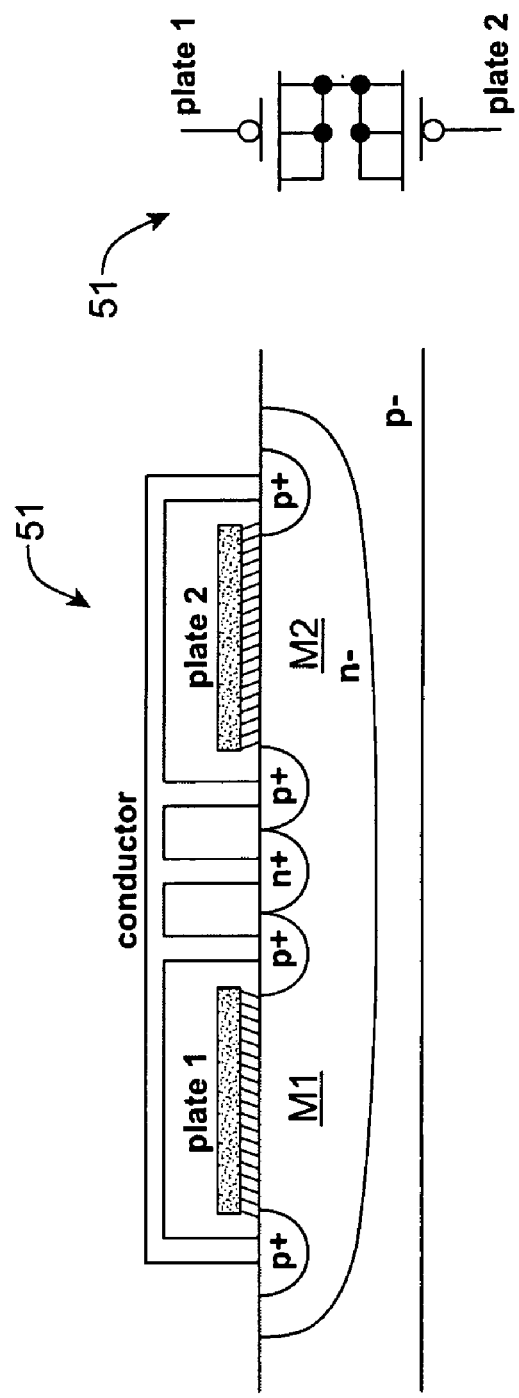
FIG. 7 is an electrical schematic diagram showing an implementation of the high-voltage capacitor of FIG. 2 using two MOSFETs. Although drawn with pFETs, the actual implementation could use pFETs, nFETs, MOSCAPs, or other MOS devices as are known to those of ordinary skill in the art.
Figure 8:
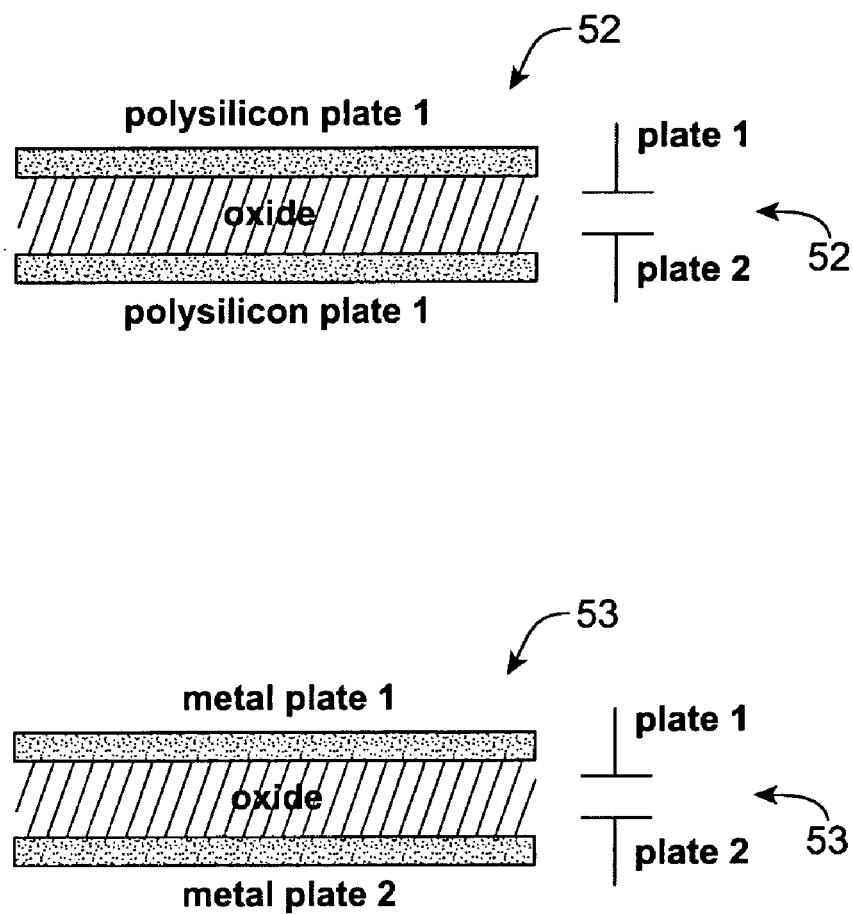
FIG. 8 is an electrical schematic diagram showing an implementation of the high-voltage capacitor of FIG. 3 using a metal-insulator-metal (MIM) capacitor or a polysilicon-insulator-polysilicon (PIP) capacitor.
Figure 9:
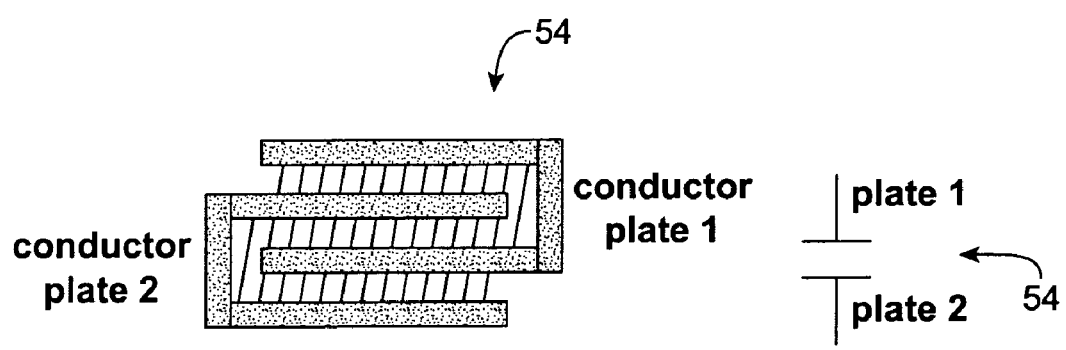
FIG. 9 is an electrical schematic diagram showing an implementation of the high-voltage capacitor of FIG. 3 using a fringe capacitor.

FIG. 3 is an electrical schematic diagram of a first modification 38 of the switch circuit of FIG. 1 in accordance with an embodiment of the present invention. In accordance with the embodiment illustrated in FIG. 3, a simple charge-based current mirror 16 uses a high-voltage capacitor C1 to couple charge to the control node 14 and thereby control the switch portion 39 of the circuit. In accordance with this embodiment of the invention, the Vout node doesn't have to remain high for extended periods of time (i.e., Vout is pulsed high), so the CNTL signal on control node 14 can be pulled down through capacitor C1 with good switching action at the Vout node. The capacitor C1 may be implemented as a polysilicon-insulator-polysilicon (PIP) capacitor or a metal-insulator-metal (MIM) capacitor as illustrated in FIG. 8, a fringe capacitor as illustrated in FIG. 9, or using the gate-to-channel capacitance of MOSFETs. Typically a pair of MOSFETs rather than a single MOSFET will be used, to increase the gate-oxide breakdown voltage above that of a single MOSFET, such as a pair of p-channel MOSFETs (e.g., pFETs in n-wells as illustrated in FIG. 7). When using series-connected MOSFETs, the individual MOSFETs in each pair do not necessarily have the same sizes and/or the same values, and each MOSFET in the pair can be constructed from a plurality of smaller MOSFETs connected in parallel. Turning to the switch portion 39 of the circuit, Diode D1 ensures that, when Vout is at a low voltage, the potential difference between the high-voltage supply and this low output voltage is shared across the drain-source junctions of cascoded pFETs P2 and P3. Diode D1 clamps the voltage at node IN to a value near the Intermediate-Voltage (IV)minus Vf, where Vf is diode D1's forward turn-on voltage drop. Alternatively, instead of coupling diode D1's anode to IV, a separate Intermediate-Voltage supply could be used to bias the anode of D1.

Figure 4:
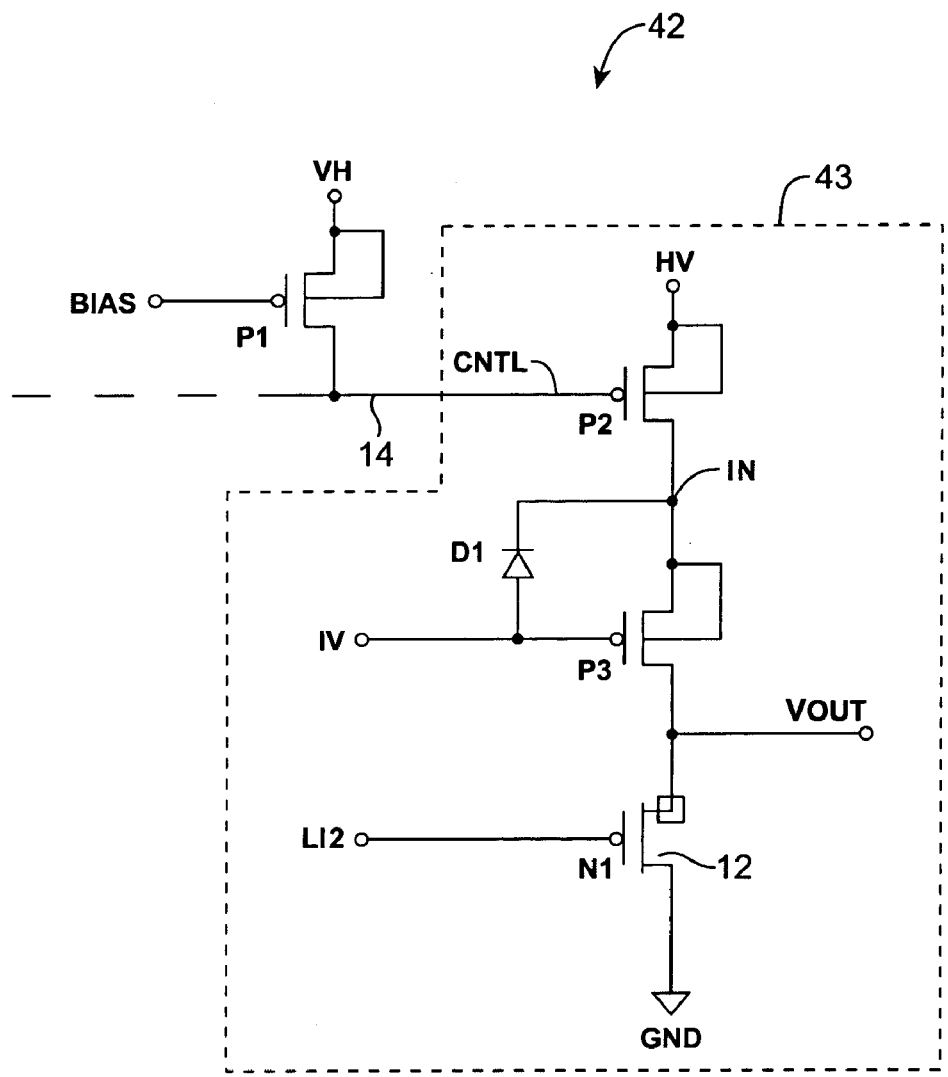
FIG. 4 is an electrical schematic diagram of a second modification of the switch circuit of FIG. 1 in accordance with another embodiment of the present invention.

FIG. 4 is an electrical schematic diagram of a second modification 42 of the switch circuit of FIG. 1 in accordance with another embodiment of the present invention. In accordance with this embodiment of the invention a single pFET P1 is added to ensure that the CNTL signal on control node 14 is pulled up to HV when the Vout node is low. P1 sources a continuous small current typically in the range of about 100 pA to about 100 nA, or can be switched on and off where in the "on" state it typically sources a current in a range of about 100 pA to about 100 µA. In either case the purpose is to pull CNTL to the high-voltage supply and so turn off pFET P2 and eliminate static power consumption when Vout is low. In other respects, the circuit 42 is similar to circuit 38 of FIG. 3 and the switch portion 43 of circuit 42 operates in the same manner as the switch portion 39 of circuit 38 in FIG. 3.

Figure 5:
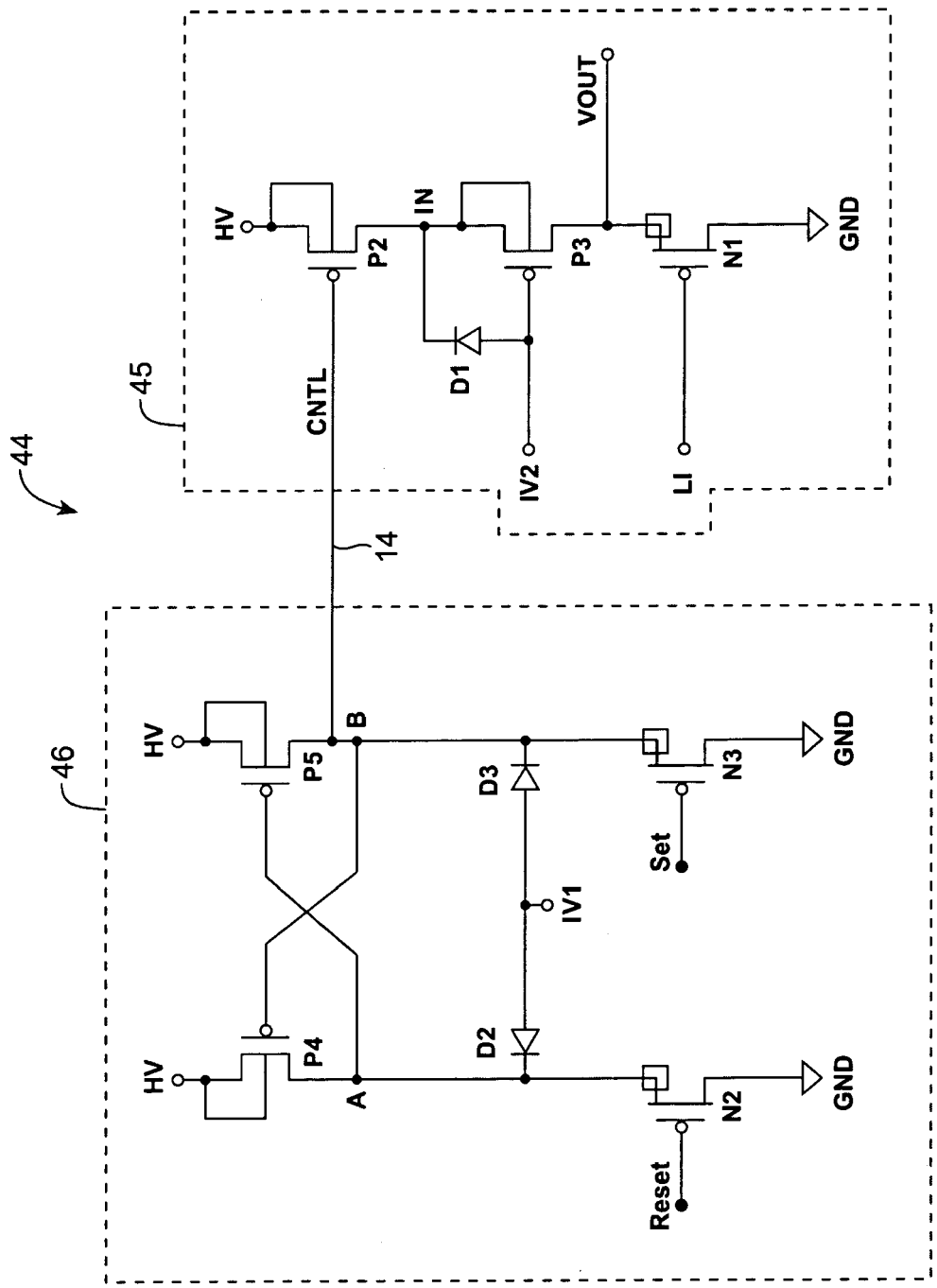
FIG. 5 is an electrical schematic diagram of a third modification of the switch circuit of FIG. 1 in accordance with another embodiment of the present invention.

FIG. 5 is an electrical schematic diagram of a third modification 44 of the switch circuit of FIG. 1 in accordance with another embodiment of the present invention. In accordance with this embodiment, a high-voltage RS (reset-set) latch circuit 46 is used for driving CNTL on control node 14 to, in turn, control the switch portion 45 of the circuit (which operates in the same manner as switch portion 39 of circuit 38 in FIG. 3. LI (coupled to N1's gate), Set and Reset are low voltage logic signals that typically swing from GND to Vdd. Set and Reset are complementary. LI is tied to Reset. HV latch 46 operates as follows. If the Reset input at the gate of HV nFET N2 is high and the corresponding Set input at the gate of HV nFET N3 is low, N2 is on, N3 is off, node A is pulled low because N2 is on and this turns on P5. Since N3 is off, the HV applied to the source of P5 brings the control node 14 up to HV. Note that in this case the HV latch 46 consumes static power from the Intermediate-Voltage supply (IV1) flowing through D2 and N2 to GND, but not from the high-voltage supply (HV). Similarly, if the Reset input at the gate of N2 is low and the Set input at the gate of N3 is high, then N2 is OFF and N3 is on (conducting) which tends to bring control node 14 down to IV1 less the voltage drop through diode D3. Again, static power is consumed from the IV1 power supply.

Figure 6:
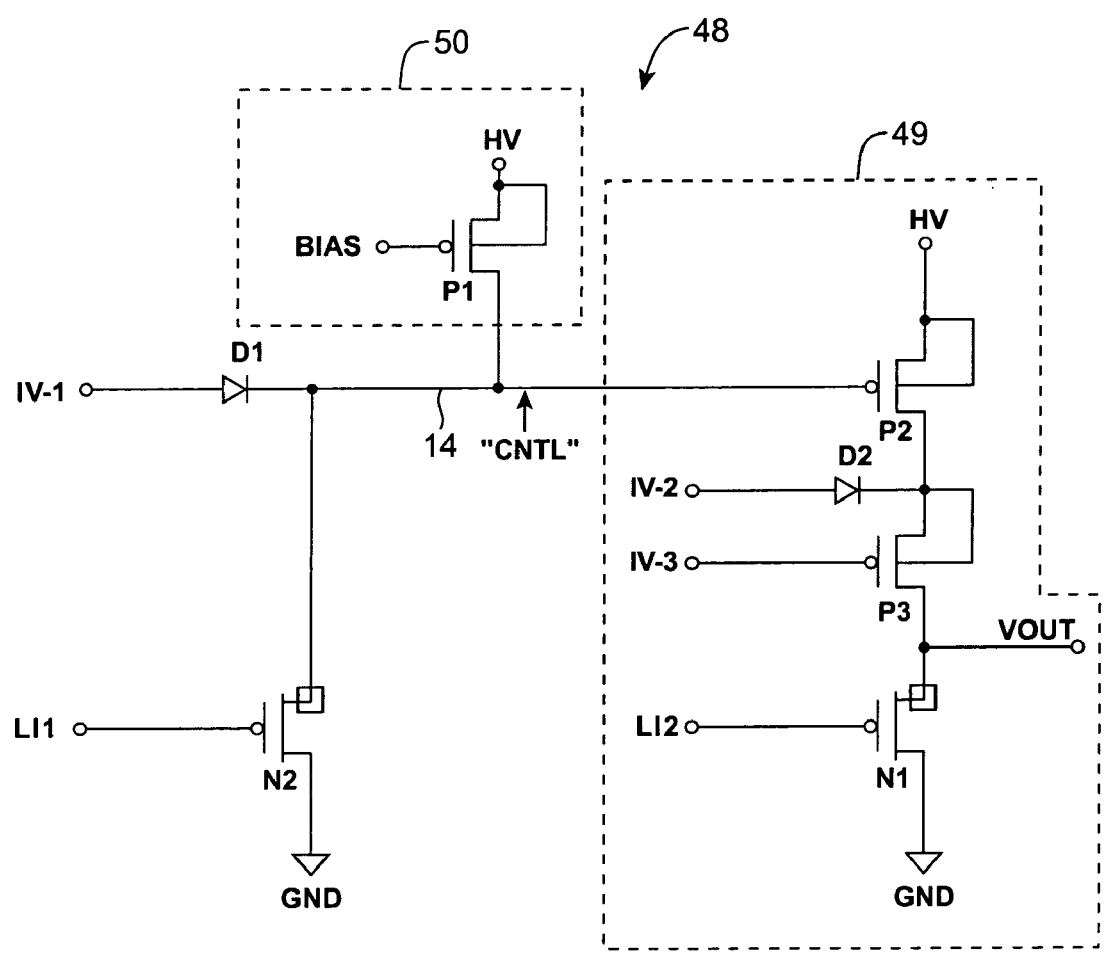
FIG. 6 is an electrical schematic diagram of a fourth modification of the switch circuit of FIG. 1 in accordance with yet another embodiment of the present invention.

FIG. 6 is an electrical schematic diagram of a fourth modification 48 of the switch circuit of FIG. 1 in accordance with yet another embodiment of the present invention. In accordance with this embodiment, two currents, the first sourced by pFET P1 in pull-up circuit 50 and the second, larger than the first and sunk by high-voltage nFET N2, are used to drive the signal CNTL on control node 14. N2 is a high-voltage nFET which may be of the LDMOS type, the DEMOS type or any other suitable high-voltage nFET type as discussed above. This circuit consumes a small amount of power from the high-voltage supply when the output voltage node Vout is high, because N2 is turned on and must overcome the small current sourced by pFET P1. In the more common situation, when the output voltage node Vout is low, this circuit does not consume any power from the high-voltage supply because N2 is turned off, the control node 14 pulls up to the high-voltage supply HV, and there is no path from the high-voltage supply to ground. In the high-voltage switch portion 49 of the circuit 48 slight differences are illustrated over switch portion 39 of circuit 38 in FIG. 3. As shown, diode D2 and pFET P3 may be connected to different Intermediate-Voltages (IV2, IV3) rather than to a single common Intermediate-Voltage (IV); the ability to use such separate supplies applies to all embodiments of the present invention, as will now be apparent to those skilled in the art (e.g., the node supplied with IV-2 may be coupled to the IV-3 supply and the IV-2 supply omitted (or vice versa).

FIG. 7 is an electrical schematic diagram of a high-voltage capacitor 51 realized with two p-channel MOSFETs M1 and M2. A bias circuit may be used to set a voltage on the n-well that is about half way between the high voltage and a low voltage (such as GND), as is well known to those of ordinary skill in the art. By this means the capacitor circuit can sustain a voltage that is twice the oxide breakdown voltage of individual MOSFETs M1 and M2.

FIG. 8 shows side-elevational cross-sectional views of a PIP (poly-insulator-poly) capacitor 52 and a MIM (metal-insulator-metal) capacitor 53. In addition to polysilicon or metal, the conductors can be fabricated from any suitable conducting material as known to those of ordinary skill in the art.

FIG. 9 is a top view of a fringe capacitor 54. The capacitance derives from fringing in interleaved conductors. In addition to polysilicon or metal, the conductors can be fabricated from any suitable conducting material as known to those of ordinary skill in the art.

Figure 10:
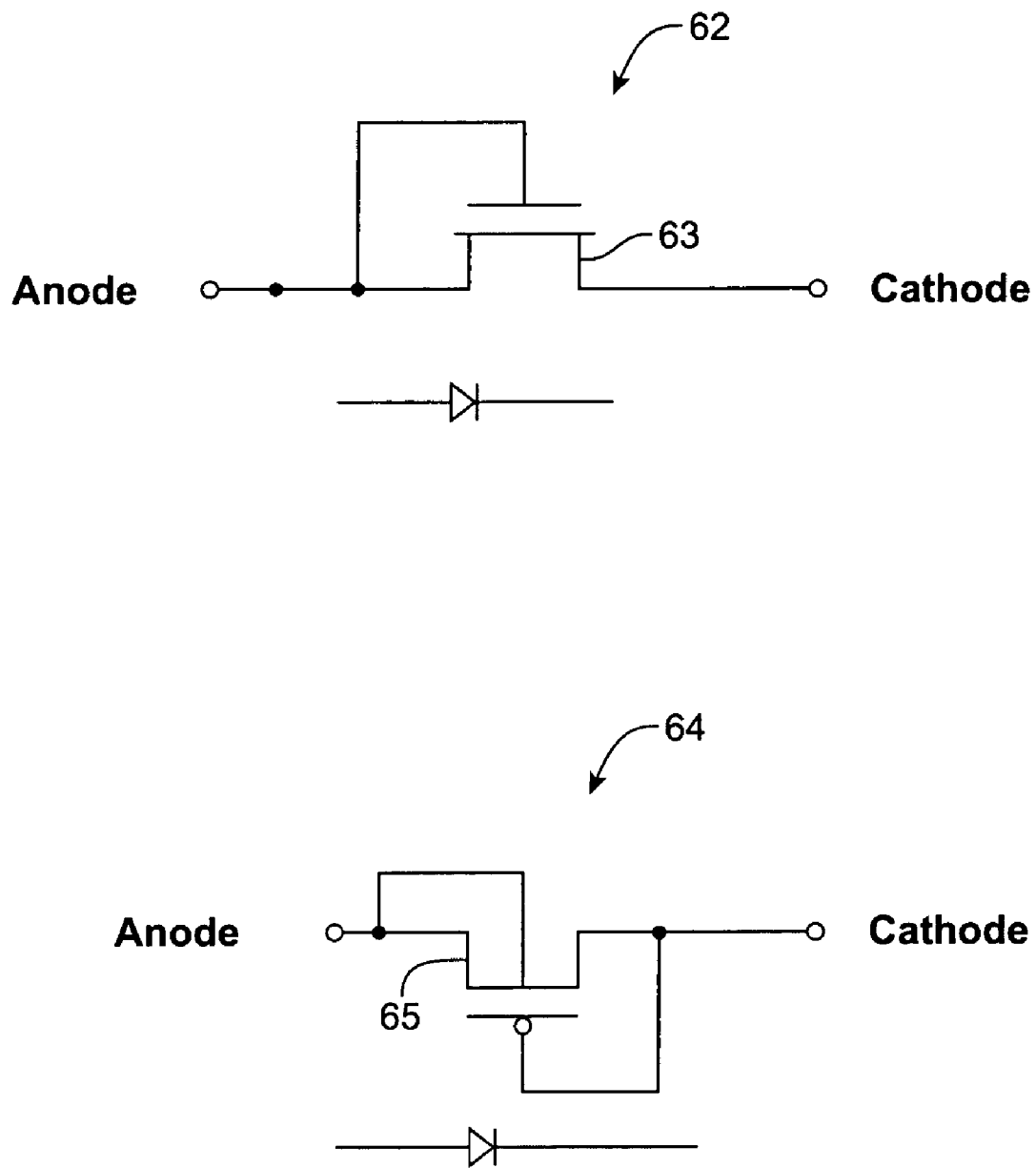
FIG. 10 is an electrical schematic diagram of two possible implementations of the diodes featured in FIGS. 3, 4, 5, 6, 14A, 14B, 15, 16, and 17.

FIG. 10 is an electrical schematic diagram of two possible implementations 62, 64 of the diodes featured in the switch circuits of FIGS. 3, 4, 5, 6, 14A, 14B, 15, 16 and 17. The diodes may be realized by a diode-connected NMOS transistor 63 or a diode-connected PMOS transistor 64.

Figure 11:
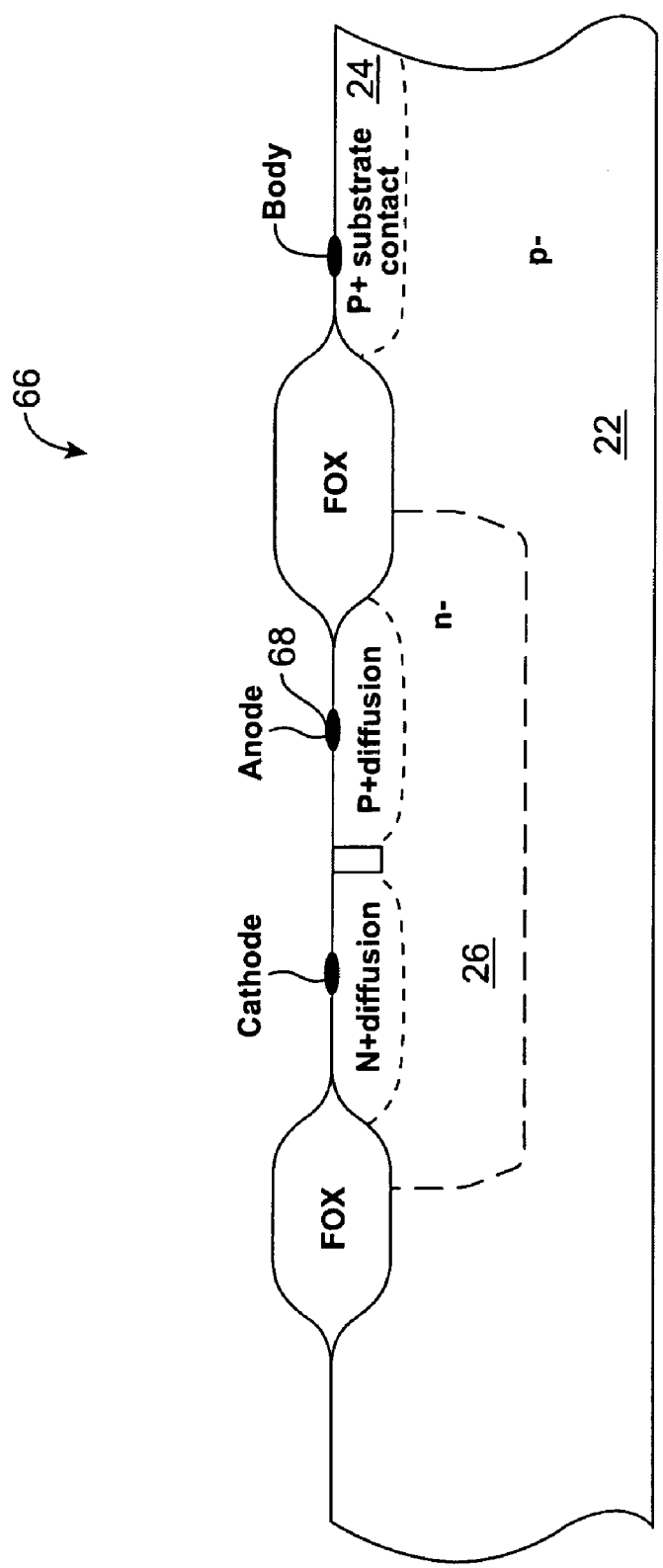
FIG. 11 is a side elevational cross-sectional view of a pn-junction diode as may be used for the diodes featured in FIGS. 3, 4, 5, 6, 14A, 14B, 15, 16, and 17.

FIG. 11 is a side elevational cross-sectional diagram illustrating an implementation of a PN diode 66 (p+ (68) to n− well (26)) as may be used to implement the diodes featured in the switch circuits of FIGS. 3, 4, 5, 6, 14A, 14B, 15, 16 and 17.

Figure 12:
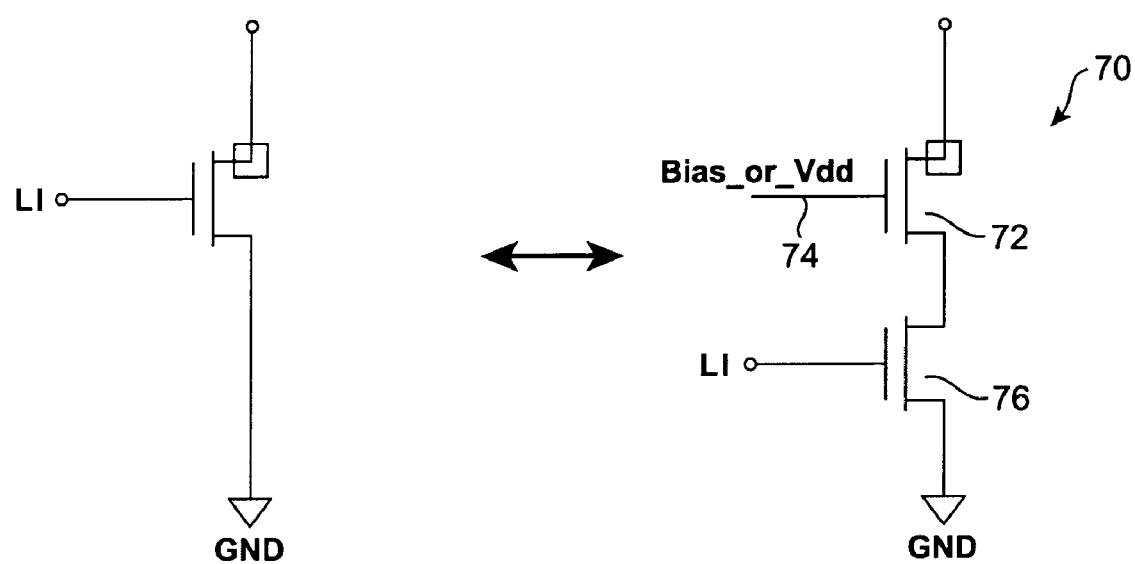
FIG. 12 is an alternative implementation of the high-voltage nFET featured in FIGS. 3, 4, 5, 6, 13, 14A, 14B, 15, 16, 17, 18.

FIG. 12 illustrates an electrical schematic diagram of an alternative circuit implementation 70 of a high-voltage nFET, that can be used as a replacement for any or all of the high-voltage nFETs in the switch circuits of FIGS. 3, 4, 5, 6, 13, 14A, 14B, 15, 16, 17 and 18. This alternative circuit configuration 70 uses a high-voltage nFET 72 as a cascode with its gate 74 connected to a bias voltage or to Vdd, and a second low-voltage nFET 76 to perform the switching operation in response to logic input "LI". Due to the cascode, the high-voltage nFET 72 in this alternative circuit configuration has a smaller maximum drain-to-gate voltage than in the configurations shown in the switch circuits of FIGS. 3, 4, 5, and 6 because its gate is pinned at Vdd rather than switching between ground and Vdd, so its gate oxide is less likely to break down under high drain voltages, resulting in less device stress and improved reliability.

Figure 13:
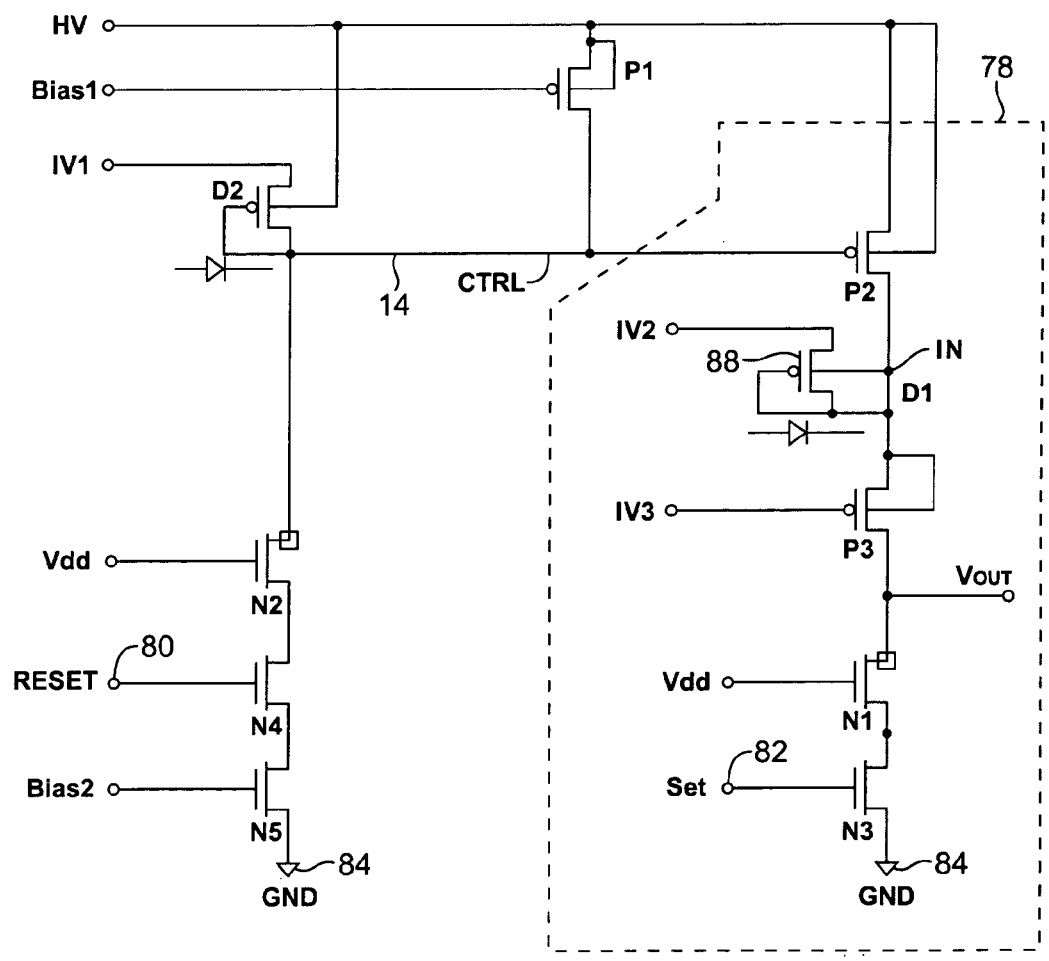
FIG. 13 is an electrical schematic diagram of a fifth modification of the switch circuit of FIG. 1 in accordance with yet another embodiment of the present invention.

FIG. 13 is an electrical schematic diagram of a fifth modification of the switch circuit of FIG. 1 in accordance with another embodiment of the present invention. In this embodiment, a switch circuit 78 provides a switched high-voltage output signal Vout in response to a complementary input logic-level state (Reset, Set, respectively) at nodes 80, 82. The nFET N5 is disposed between the source of nFET N4 and ground 84 and is biased by bias voltage source Bias2. A high-voltage nFET N2 is disposed between the drain of nFET N4 and control node 14. The pFET 86 is configured as a diode D2 with gate and drain coupled to control node 14, well coupled to a high-voltage supply HV, and source coupled to Intermediate-Voltage IV1. The pFET P1 is configured with its source and well coupled to the high-voltage supply HV, its gate coupled to Bias1 (a bias voltage set below HV), and its drain coupled to control node 14. The pFET P2 is configured with its source and well coupled to the high-voltage supply HV, its gate coupled to control node 14, and its drain coupled to intermediate node IN. A diode-connected pFET 88 is configured with its gate, drain and well coupled to intermediate node IN and its source coupled to Intermediate-Voltage IV2. The pFET P3 is coupled between intermediate node IN and output voltage node Vout with its gate coupled to intermediate voltage IV2, its source and well coupled to node IN, and its drain coupled to node Vout. High voltage nFET N1 is configured with its drain coupled to node Vout, its source coupled to the drain of nFET N3, and its gate coupled to Vdd. The nFET N3 has its source coupled to GND (ground) 84 and its gate coupled to Set logic input node 82. In accordance with this embodiment, the following voltages may be used: HV=10V, Bias1=9.3V, IV1=6V, Vdd=3.3V, Bias2=1V and IV2=6V. In this circuit note that the current drawn by nFET N5 is larger that the current sourced by the pFET P1, so when Reset node 80 is high, control node 14 pulls down until diode D2 turns on clamping control node 14 at IV1 less the voltage drop across diode D2. If Reset is low and Set if high, then transistor N4 is off and control node 14 goes high to HV, similarly transistor N3 is on and Vout goes low.

Figure 14A:
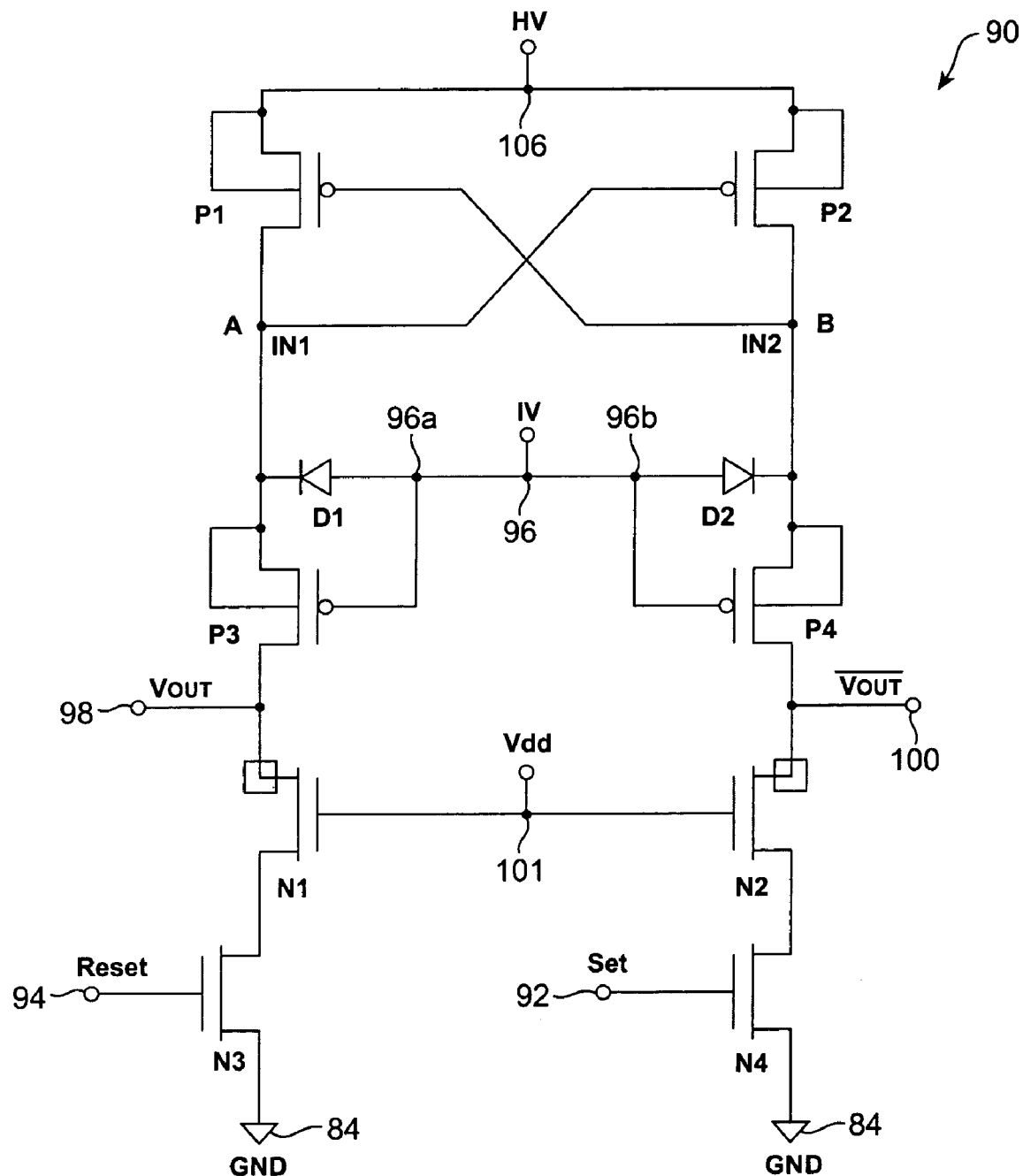
FIG. 14A is an electrical schematic diagram of a sixth modification of the switch circuit of FIG. 1 in accordance with yet another embodiment of the present invention.

FIG. 14A is an electrical schematic diagram of a sixth modification 90 of the switch circuit of FIG. 1 in accordance with another embodiment of the present invention. In accordance with this embodiment of the invention, the switch circuit 90 provides a switched complementary high-voltage output signal Vout in response to two complementary input logic-level states on nodes 92 (Set) and 94 (Reset) and includes: a first and a second pFET P1, P2 having cross-coupled gates and drains with sources both coupled to a high-voltage supply node; a first and a second diode D1, D2 having their anodes coupled to an Intermediate-Voltage node 96 supplied with Intermediate-Voltage IV and their respective cathodes coupled to the respective drains of said first and second pFETs P1, P2; a third and a fourth pFET P3, P4 having their gates both coupled to said intermediate voltage node 96, their respective drains coupled to respective first and second complementary output voltage nodes 98, 100, and their respective sources coupled to said respective drains of said first and second pFETs P1, P2; a first and a second high-voltage nFET N1, N2 having their gates coupled to Vdd at Vdd supply node 101, their respective sources coupled to the drains of respective nFETs N3, N4, and their respective drains coupled to the respective complementary output voltage nodes 98, 100. The nFETs N3, N4 are configured with their sources coupled to GND 84, gates coupled to Reset and Set nodes 94, 92 (respectively), and drains coupled to the sources of HV nFETs N1, N2 (respectively). In this circuit, High-Voltage HV may be about 10V, Intermediate-Voltage IV may be about 6V, and Vdd may be about 3.3V in accordance with one embodiment. In another embodiment, there may be a pair of different intermediate voltages and node 96 may be divided into nodes 96a and 96b which are not connected to one another, with one intermediate voltage being supplied to node 96a and another to node 96b. The diodes D1, D2 may be fabricated from diode-connected FETs such as pFETs in an nWell. Note that this circuit consumes zero static power in either the on state or the off state and does not require external bias voltages.

Figure 14B:
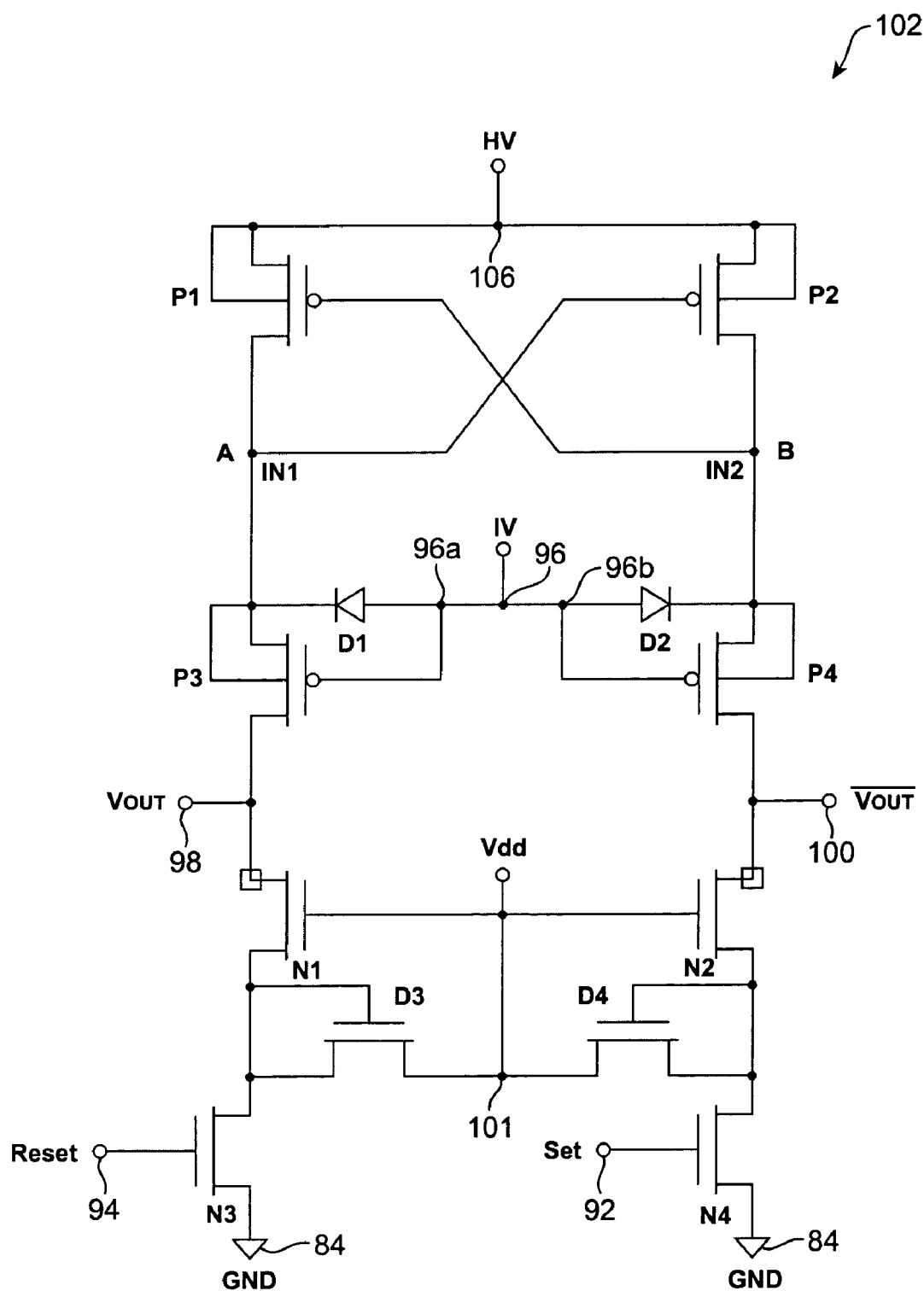
FIG. 14B is a modification of FIG. 14A adding diode-coupled transistors D3 and D4 to limit the voltage across the high voltage nFETs.

FIG. 14B is an electrical schematic diagram of a modification 102 of the circuit 90 illustrated in FIG. 14A and discussed in detail above. In the circuit 102 of FIG. 14B, diodes D3 and D4 are represented as diode coupled nFETs with their anodes coupled to Vdd and their cathodes coupled, respectively, to the source of high-voltage transistor N1 and drain of nFET N3 and to the source of high-voltage transistor N2 and drain of nFET N4. The diodes D3 and D4 could be fabricated in any conventional manner and this circuit also consumes zero static power in either the on state or the off state and does not require external bias voltages.

Figure 15:
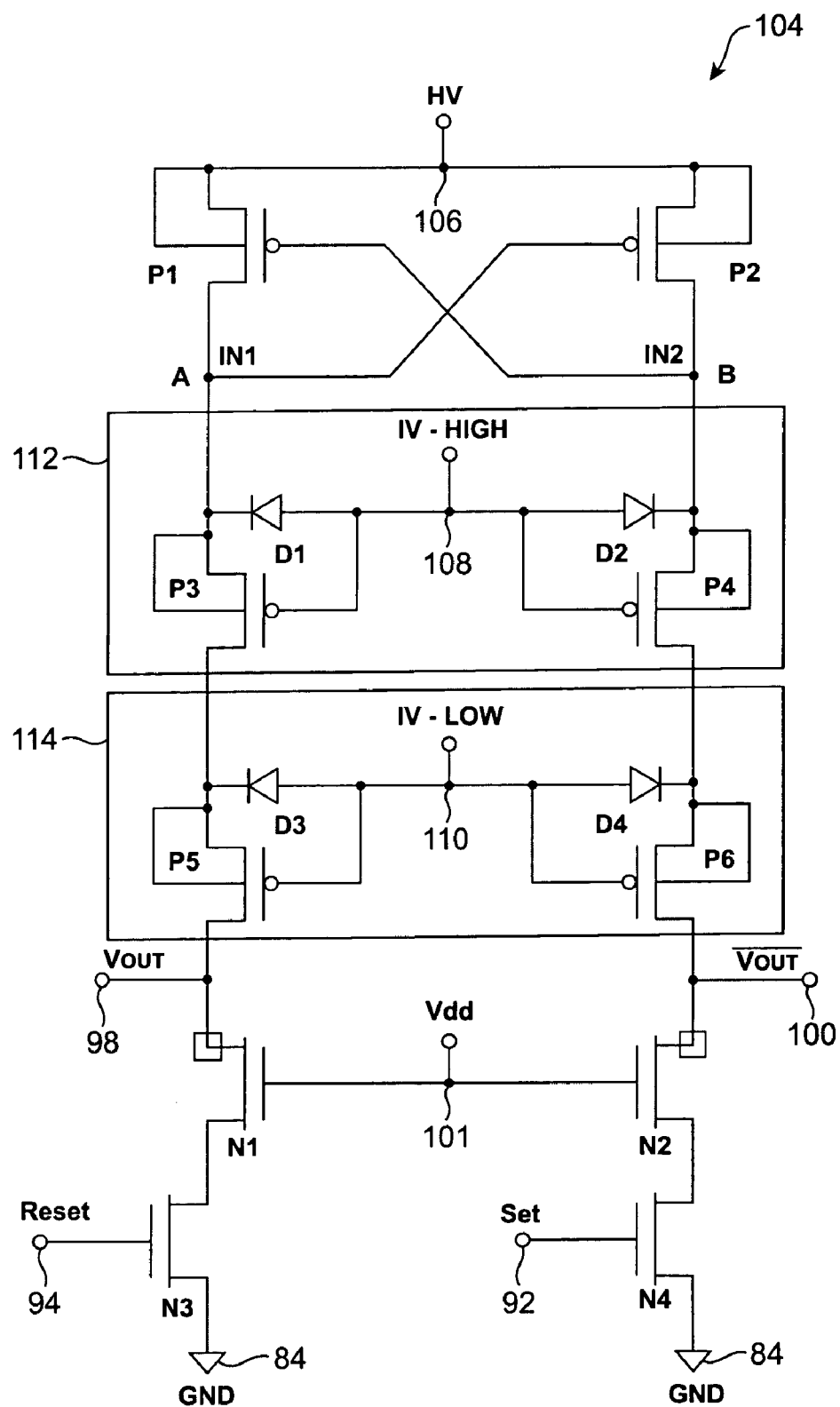
FIG. 15 is an electrical schematic diagram of a seventh modification of the switch circuit of FIG. 1 in accordance with yet another embodiment of the present invention.

FIG. 15 is an electrical schematic diagram of a seventh modification 104 of the switch circuit of FIG. 1 in accordance with another embodiment of the present invention. In accordance with this embodiment of the invention, the switch circuit 104 provides a complementary switched high-voltage output signal Vout, in response to two complementary input logic-level states on nodes 92 (Set) and 94 (Reset) and includes: a first and a second pFET P1, P2 having cross-coupled gates and drains with sources both coupled to a high-voltage (HV) supply node 106; a first and a second diode D1, D2 having their anodes coupled to a first Intermediate-Voltage (IV-HIGH) node 108 and their respective cathodes coupled to the respective drains of said first and second pFETs P1, P2; a third and a fourth pFET P3, P4 having their gates both coupled to said first Intermediate-Voltage node 108, their respective sources coupled to the respective drains of pFETs P1, P2, their respective drains coupled to respective sources of fifth and sixth pFETs P5, P6, gates of said fifth and sixth pFETs P5, P6 respectively coupled to a second Intermediate-Voltage (IV-LOW) node 110, a third and a fourth diode D3, D4 having their anodes coupled to the second Intermediate-Voltage node 110 and their respective cathodes coupled respectively to the drains of said third and fourth pFETs P3, P4; the drains of said fifth and sixth pFETs P5, P6 coupled respectively to complementary output voltage nodes 98, 100; a first and a second high-voltage nFET N1, N2 having both of their gates coupled to Vdd at Vdd supply node 101, their respective sources coupled to the drains of nFETs N3, N4, and their respective drains coupled to the respective complementary output voltage nodes 98, 100. The nFETs N3, N4 are configured with their sources coupled to GND 84, gates coupled to complementary logic input nodes Set (92) and Reset (94) (respectively) and drains coupled to sources of HV nFETs N1, N2 (respectively). In this circuit, the High-Voltage HV may be about 11V, Intermediate-Voltage-High (IV-HIGH) may be about 8.5V and Intermediate-Voltage-Low (IV-LOW) may be about 6V with Vdd about 3.3V in accordance with one embodiment of the present invention. This version uses two cascode stages 112, 114 (double cascode) to reduce the stress on the cascode pFET transistors with respect to the versions of FIGS. 14A and 14B. This technique may also be applied to the circuits of FIGS. 3, 4, 5, 6, 13 and 14. The diodes D1, D2, D3 and D4 may be fabricated from diode-connected FETs such as pFETs in an n– well or otherwise as will now be apparent to those of ordinary skill in the art.

Figure 16:
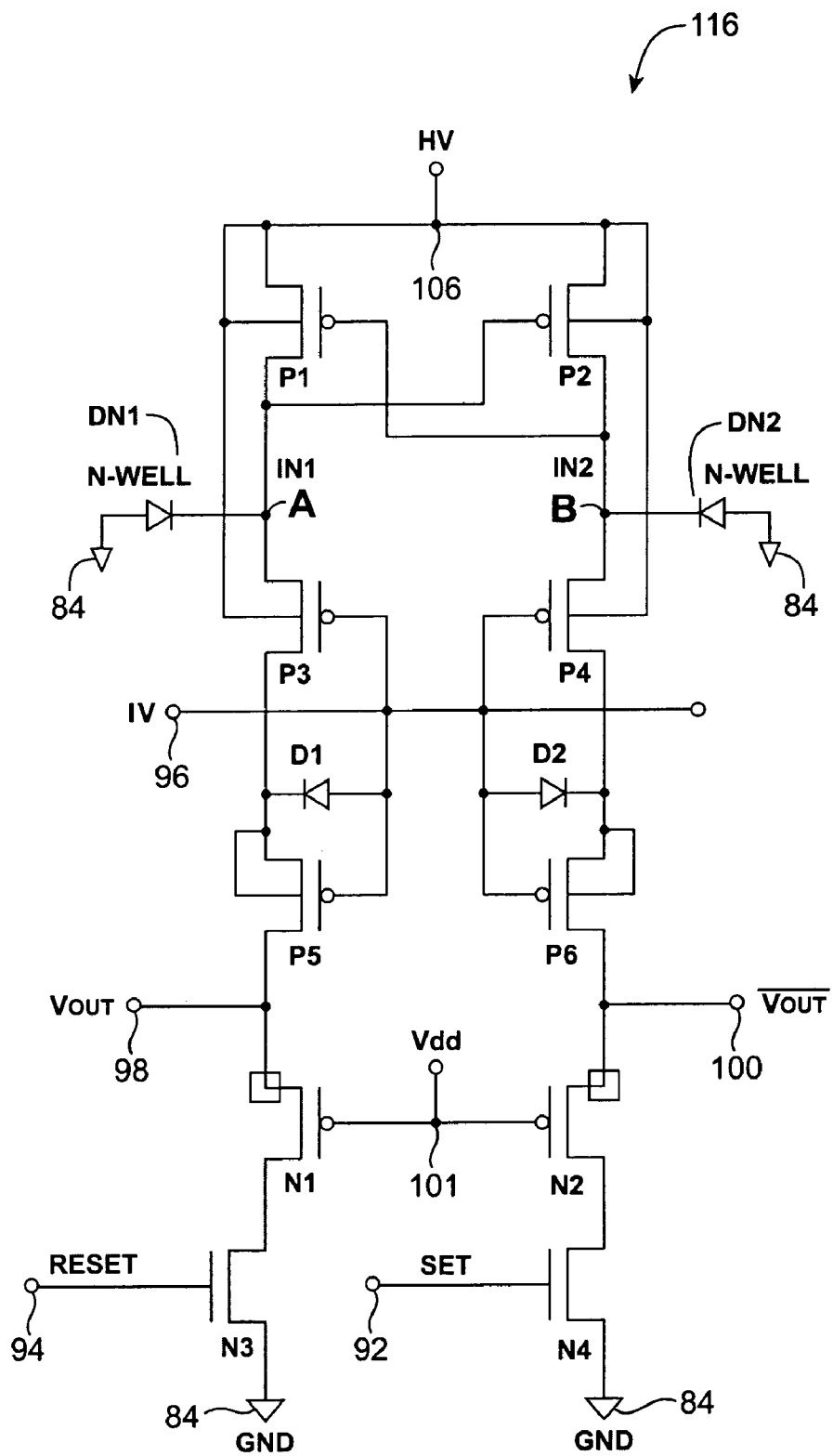
FIG. 16 is an electrical schematic diagram of an eighth modification of the switch circuit of FIG. 1 in accordance with yet another embodiment of the present invention.

FIG. 16 is an electrical schematic diagram of an eighth modification 116 of the switch circuit of FIG. 1 in accordance with another embodiment of the present invention, illustrating an alternative circuit implementation of a high-voltage latch. This alternative circuit configuration uses a second set of cascode devices (P3 and P4) to reduce the parasitic capacitance at drain nodes ("A" and "B") of the latching pFET pair (P1 and P2) to GND. Reducing the capacitance of nodes A & B to GND prevents both of the latching pFET transistors (P1 and P2) from turning on simultaneously, due to capacitive voltage division from the gate nodes of P1 and P2 to GND, when ramping up the high-voltage. In many cases, the high-voltage is generated by a high-impedance power supply which cannot handle the resulting current draw that occurs when both P1 and P2 are conducting simultaneously. By tying the n– well connections of P3 and P4 to the high-voltage node 106, the capacitance of nodes A and B are reduced when compared with the previously described HV switches. Small (low capacitance) n– well diodes DN1 and DN2, with their cathodes tied to nodes A and B and their anodes tied to GND, clamp the drain nodes of P1 and P2 to one diode voltage drop below GND when the high-voltage input node 106 is driven toward GND. These diodes are typically formed as shown in FIG. 11, but may be formed from diode-connected FETs such as pFETs in n-wells and the like. This approach of clamping nodes A and B to a diode below GND, and therefore to about the same voltage, discharges the cross-coupled pair (P1, P2) and thereby prevents the circuit from developing a "memory" for the previously latched state. It also prevents nodes A and B from reaching approximately −6V. In one embodiment of this circuit, the High-Voltage HV may be about 10V, the Intermediate-Voltage IV may be about 6V, and Vdd may be about 3.3V. This double-cascode design uses a single Intermediate-Voltage (IV) applied at node 96. It consumes zero static power in the on state and in the off state.

Figure 17:
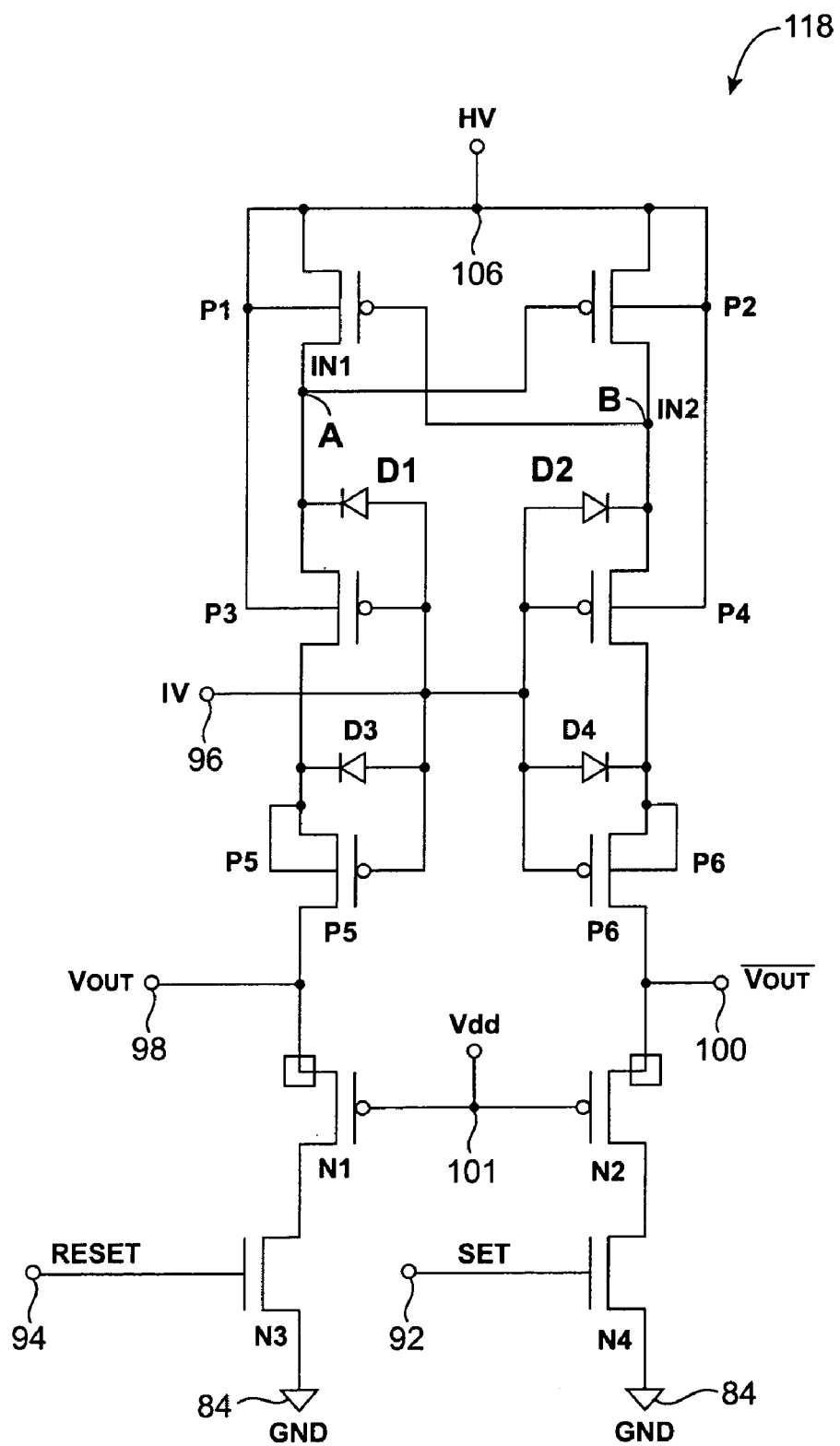
FIG. 17 is an electrical schematic diagram of a ninth modification of the switch circuit of FIG. 1 in accordance with yet another embodiment of the present invention.

FIG. 17 is an electrical schematic diagram of a ninth modification 118 of the switch circuit of FIG. 1 in accordance with another embodiment of the present invention, illustrating an alternative circuit implementation of a high-voltage latch. This alternative circuit configuration connects the anodes of diodes D1 and D2 to the Intermediate-Voltage node 98 rather than to GND (compare with circuit 116 in FIG. 16), to reduce the maximum Vds across transistors P1 or P2 when Vout on node 98 or its complement on node 100 are driven to GND, respectively. Small (low capacitance) n-well diodes, with their cathodes tied to nodes A and B and their anodes tied to the Intermediate-Voltage (IV) node 96, clamp the drain nodes of P1 and P2 to one Vf below IV when the High-Voltage (HV) input node 106 is driven toward GND. These diodes D1 and D2 are typically formed as shown in FIG. 11, but may be formed from diode-connected FETs such as pFETs in n− well, or the like. In one embodiment of this circuit, the High-Voltage HV may be about 10V, the Intermediate-Voltage IV may be about 6V, and Vdd may be about 3.3V. This double-cascode design uses a single Intermediate-Voltage. It consumes zero static power in the on state and in the off state.

The version of the circuit shown in FIG. 14A lacks the transistors labeled in FIG. 16 as P3 and P4. Accordingly, without these two transistors, the n− well capacitance of the pFET switches (P3, P4 in FIGS. 14A and P5, P6 in FIG. 16) is located at nodes A and B (drains of P1, P2, respectively). When the High-Voltage supply is stepped from 0 to about 10 Volts DC, this n− well capacitance shares charge with the gate capacitance of transistors P1 and P2. This can cause both P1 and P2 to turn on and can, under certain circumstances, prevent the high-voltage switch circuit from latching correctly.

Adding transistors P3 and P4 in FIG. 16 solved this n− well capacitance charge sharing issue because the n− wells of P3 and P4 (FIG. 16) are coupled to the High-Voltage supply. However, without the parasitic n− well diodes on nodes A and B illustrated in FIG. 16, these nodes may not discharge completely when the High-Voltage supply is stepped back down to GND. One of these nodes, depending upon which side of the switch was turned on, goes below GND when the High-Voltage supply goes low. This can result in a sometimes undesired memory of the last switch state and can make it difficult to change the state of the switch. Accordingly, the small n− well diodes DN1 and DN2 with their anodes coupled to GND and their cathodes coupled to node A and node B, respectively, solve this issue by clamping nodes A and B to GND.

Although the n-well diodes DN1 and DN2 in FIG. 16 are smaller than the PMOS n− wells discussed above, they can still cause enough charge sharing on nodes A and B of the FIG. 16 embodiment to raise issues. For example, with a 1.4 micron n− well diode, there is insufficient added capacitance to be a problem. However, with larger structures, such as a 3.0 micron n− well diode the capacitance increases to the point that it can be an issue. This potential problem can also be obviated by the approach illustrated in FIG. 18, discussed below.

In the circuit shown in FIG. 17, diodes D1 and D2 serve to provide a discharge path for nodes A and B. Holding the anodes of D1 and D2 at IV instead of GND eliminates some of the capacitance otherwise present. Using MOS diodes (shorted MOSFETs) instead of n− well diodes also offers the opportunity to make much smaller structures with much smaller capacitances than using n− well diodes.

Figure 18:
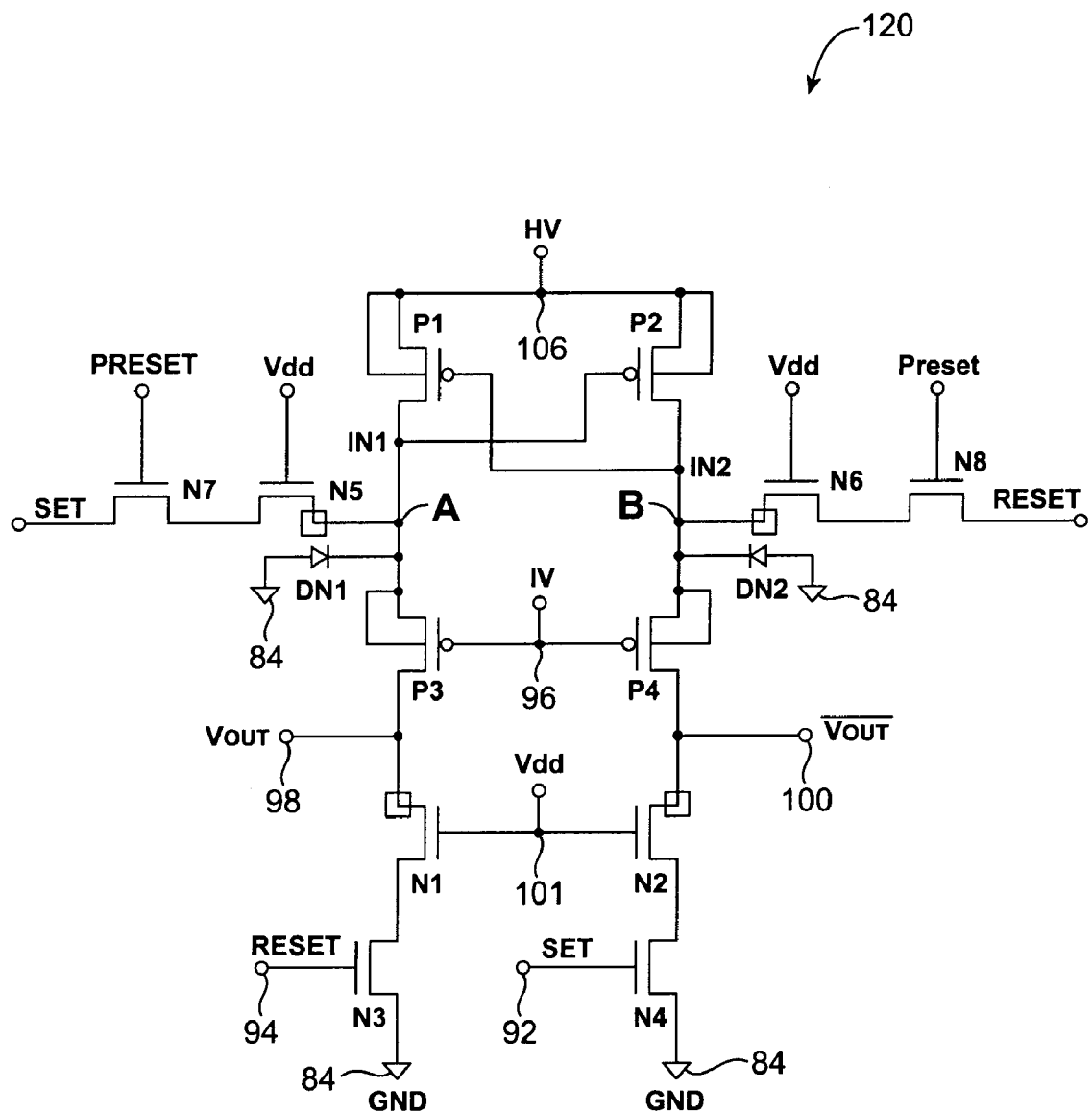
FIG. 18 is an electrical schematic diagram of a tenth modification of the switch circuit of FIG. 1 in accordance with yet another embodiment of the present invention.

FIG. 18 is an electrical schematic diagram of a tenth modification 120 of the switch circuit of FIG. 1 in accordance with yet another embodiment of the present invention, illustrating an alternative circuit implementation of a high-voltage latch. Note that intermediate nodes A (IN1) and B (IN2) are clamped by n-well diodes DN1 and DN2, respectively, as described above in connection with the FIG. 16 embodiment. This alternative circuit uses a Preset input along with the Set and Reset inputs at nFETs N7 and N8 to "preset" or "precharge" one of the drain nodes (A or B) of the latching pFET pair (P1 and P2) before the High-Voltage supply coupled to HV node 106 is ramped high. Isolation from the high-voltages present in the switch circuit is provided by series connected (cascoded) high-voltage nFETs N5 and N6, respectively, which are left in the on state by applying Vdd to their gates. Presetting one of intermediate nodes A (IN1) or B (IN2) prevents both P1 and P2 from turning on simultaneously, due to capacitive voltage division from their gate nodes to GND, when ramping the High-Voltage supply. In many cases, the High-Voltage is generated by a high-impedance power supply which cannot handle the resulting current draw that occurs when both P1 and P2 are conducting simultaneously. In this circuit, the High-Voltage HV may be about 10V, the Intermediate-Voltage IV may be about 6V, and Vdd may be about 3.3V. The circuit consumes zero static power in either the on state or the off state. Note that in the claims where a circuit element is referred to as being "responsive" to a logic level signal such as Reset, it is intended to include as well the situation where the circuit element is in fact responsive to the inverse or complement of the same signal, as, for example, the situation where an nFET responsive to Reset is replaced with a pFET which would have to be responsive to the complement of Reset (Set) in order to perform the same function.

As is now apparent, diode-transistor pairs (D1 and P3 in FIG. 3, but present in all circuits of the invention) are a key aspect in several embodiments of the present invention. For example, looking at FIG. 14A, when Vout on node 98 is low, the diode-transistor pair D1-P3 ensures that none of the series pFETs (P1 & P3) have excessive drain-to-source voltage across them. In FIG. 15 this idea is expanded upon by using two diode-transistor pairs in series (D1-P3 and D3-P5 on the left side of the circuit and D2-P4 and D4-P6 on the right side of the circuit) to further reduce the voltage stress on the three series pFETs (P1-P3-P5 on the left and P2-P4-P6 on the right).

Finally, those of ordinary skill in the art will now realize that CMOS silicon-on-sapphire (SOS) and silicon-on-insulator (SOI) technologies may also be used to fabricate the high-voltage switches as contemplated herein. Both of these technologies use insulating substrate materials for isolating individual devices. In these approaches, an insulating material, typically silicon dioxide, is placed over the substrate material (either sapphire in SOS or silicon in SOI, and potentially other materials as will be apparent to those of ordinary skill in the art). A thin silicon layer is then placed on top of the oxide. Transistors are then fabricated in a similar fashion to bulk CMOS processes. Floating-gate devices may be used in these processes as well.

While embodiments and applications of this invention have been shown and described, it would be apparent to those skilled in the art having the benefit of this disclosure that many more modifications than mentioned above are possible without departing from the inventive concepts herein. For example, it is to be noted that while the present invention may be implemented in a single-well single-poly process and will work with various logic voltage levels from less than 1 Volt to greater than 10 Volts, the invention is not so limited and can be implemented in processes that support multiple polysilicon layers, multiple wells, and/or higher voltage devices. Furthermore, the concept of a high-voltage nFET as used herein is intended to encompass not only n-well devices, but also NLDD (N-type Lightly Doped Drain) devices and other lightly doped, or isolated structures that increase the reliable drain-to-gate and drain-to-source voltages of the device so that it, in effect, behaves like an LDMOS or DEMOS nFET in this respect. Finally, those of ordinary skill in the art will now recognize that MOS gates may be fabricated in a number of ways other than by heavily doped polycrystalline silicon. For example, they may be fabricated of metal or other conductors. The invention, therefore, is not to be restricted except in the spirit of the appended claims.

What is claimed is:

1. A circuit for providing a switched high-voltage signal in response to an input logic-level state, comprising:
   a first pFET having a source, drain, well and gate terminal, the source and well coupled to a source of a high-voltage signal, the drain coupled to an intermediate node and the gate coupled to a control node;
   a second pFET having a source, drain, well and gate terminal, the source and well coupled to the intermediate node, the drain coupled to a voltage output node and providing the switched high-voltage signal, the gate coupled to a source of a first intermediate voltage, said first intermediate voltage being intermediate said high-voltage and a ground;
   a diode having its anode coupled to a source of a second intermediate voltage, said second intermediate voltage being intermediate said high-voltage and the ground, and its cathode coupled to the intermediate node; and
   a high-voltage MOS nFET having a source, drain and gate terminal, the source coupled to the ground, the drain coupled to the voltage output node and the gate coupled to a source of the input logic-level state.

2. The circuit of claim 1, wherein said first intermediate voltage and said second intermediate voltage are the same voltage.

3. The circuit of claim 1, wherein said high-voltage nFET includes a drain having an n+ region disposed in an n– well.

4. The circuit of claim 1, further comprising:
   a pull-up circuit coupled to said control node, said high-voltage supply and a source of a bias signal.

5. The circuit of claim 2, further comprising:
   a pull-up circuit coupled to said control node, said high-voltage supply and a source of a bias signal.

6. The circuit of claim 4 wherein said pull-up circuit comprises:
   a pFET having a source and a well coupled to said high-voltage supply, a drain coupled to said control node, and a gate coupled to said source of said bias signal.

7. The circuit of claim 5, wherein said pull-up circuit comprises:
   a pFET having a source and a well coupled to said high-voltage supply, a drain coupled to said control node, and a gate coupled to said source of said bias signal.

8. A circuit for providing a switched high-voltage signal in response to a first and a second logic level input, comprising:
   a first pFET having a source, drain, well and gate terminal, the source and well coupled to a high-voltage supply, the drain coupled to an intermediate node and the gate coupled to a control node;
   a second pFET having a source, drain, well and gate terminal, the source and well coupled to the intermediate node, the drain coupled to a voltage output node and providing the switched high-voltage signal, the gate coupled to a source of a first intermediate voltage, said first intermediate voltage being intermediate said high-voltage supply and a ground;
   a diode having its anode coupled to a source of a second intermediate voltage, said second intermediate voltage being intermediate said high-voltage and the ground, and its cathode coupled to the intermediate node;
   a high-voltage MOS nFET having a source, drain and gate terminal, the source coupled to the ground, the drain coupled to the voltage output node and the gate coupled to a source of the first logic-level input;
   a pull-up circuit coupled to said control node and to said high-voltage supply; and
   a capacitor coupled at a first terminal to the second logic level input and at a second terminal to said control node and to said pull-up circuit.

9. The circuit of claim 8, wherein said first intermediate voltage and said second intermediate voltage are the same voltage.

10. The circuit of claim 8, wherein said high-voltage nFET includes a drain having an n+ region disposed in an n– well.

11. The circuit of claim 8, wherein said pull-up circuit comprises a pFET having a source and a well coupled to said high-voltage supply, a drain coupled to said second terminal of said capacitor, a gate coupled to said control node, and said gate and said drain coupled together.

12. The circuit of claim 9, wherein said pull-up circuit comprises a pFET having a source coupled to said high-voltage supply, a drain coupled to said second terminal of said capacitor, a gate coupled to said control node, and said gate and said drain coupled together.

13. A circuit for providing a switched high-voltage signal in response to an input logic-level state, comprising:
   a first pFET having a source, drain, well and gate terminal, the source and well coupled to a source of a high-voltage signal, the drain coupled to a first intermediate node and the gate coupled to a control node;
   a second pFET having a source, drain, well and gate terminal, the source and well coupled to the first intermediate node, the drain coupled to a voltage output node and providing the switched high-voltage signal, the gate coupled to a source of a first intermediate voltage, said first intermediate voltage being intermediate said high-voltage and a ground;

a first diode having its anode coupled to a source of a second intermediate voltage, said second intermediate voltage being intermediate said high-voltage and the ground, and its cathode coupled to the first intermediate node;

a MOS nFET having a source, drain and gate terminal, the source coupled to the ground, the drain coupled to a second intermediate node and the gate coupled to a source of the input logic-level state; and a high-voltage MOS nFET having a source, drain and gate terminal, the source coupled to the drain of the MOS nFET, the drain coupled to the voltage output node and the gate coupled to a source of Vdd, said Vdd being a voltage between said intermediate voltages and the ground.

14. The circuit of claim 13, wherein said second intermediate node is coupled to the source of Vdd through a diode.

15. The circuit of claim 13, wherein said first intermediate voltage and said second intermediate voltage are the same voltage.

16. The circuit of claim 13, wherein said high-voltage nFET includes a drain having an n+ region disposed in an n– well.

17. The circuit of claim 13, further comprising:
a pull-up circuit coupled to said control node, said high-voltage supply and a source of a bias signal.

18. The circuit of claim 14, further comprising:
a pull-up circuit coupled to said control node, said high-voltage supply and a source of a bias signal.

19. The circuit of claim 15, further comprising:
a pull-up circuit coupled to said control node, said high-voltage supply and a source of a bias signal.

20. The circuit of claim 18 wherein said pull-up circuit comprises:
a pFET having a source and a well coupled to said high-voltage supply, a drain coupled to said control node, and a gate coupled to said source of said bias signal.

21. The circuit of claim 19 wherein said pull-up circuit comprises:
a pFET having a source and a well coupled to said high-voltage supply, a drain coupled to said control node, and a gate coupled to said source of said bias signal.

22. A circuit for providing a switched high-voltage signal in response to a first and a second logic level input, comprising:
a first pFET having a source, drain, well and gate terminal, the source and well coupled to a high-voltage supply, the drain coupled to a first intermediate node and the gate coupled to a control node;
a second pFET having a source, drain, well and gate terminal, the source and well coupled to the first intermediate node, the drain coupled to a voltage output node and providing the switched high-voltage signal, the gate coupled to a source of a first intermediate voltage, said first intermediate voltage being intermediate said high-voltage supply and a ground;
a first diode having its anode coupled to a source of a second intermediate voltage, said second intermediate voltage being intermediate said high-voltage and the ground, and its cathode coupled to the first intermediate node;
a MOS nFET having a source, drain and gate terminal, the source coupled to the ground, the drain coupled to a second intermediate node and the gate coupled to a source of the input logic-level state; and
a high-voltage MOS nFET having a source, drain and gate terminal, the source coupled to the drain of the MOS nFET, the drain coupled to the voltage output node and the gate coupled to a source of Vdd, said Vdd being a voltage between said first and second intermediate voltages and the ground; and
a pull-up circuit coupled to said control node and to said high-voltage supply.

23. The circuit of claim 22, further comprising:
capacitor coupled at a first terminal to the second logic-level input and at a second terminal to said control node and to said pull-up circuit.

24. The circuit of claim 22, wherein said first intermediate voltage and said second intermediate voltage are the same voltage.

25. The circuit of claim 23, wherein said first intermediate voltage and said second intermediate voltage are essentially the same voltage.

26. The circuit of claim 22, wherein said high-voltage nFET includes a drain having an n+ region disposed in an n– well.

27. The circuit of claim 23, wherein said high-voltage nFET includes a drain having an n+ region disposed in an n– well.

28. The circuit of claim 22, wherein said pull-up circuit comprises:
a pFET having a source and a well coupled to said high-voltage supply, a drain coupled to said second terminal of said capacitor, a gate coupled to said control node, and said gate and said drain coupled together.

29. The circuit of claim 23, wherein said pull-up circuit comprises:
a pFET having a source and a well coupled to said high-voltage supply, a drain coupled to said second terminal of said capacitor, a gate coupled to said control node, and said gate and said drain coupled together.

30. The circuit of claim 24, wherein said pull-up circuit comprises a pFET having a source coupled to said high-voltage supply, a drain coupled to said second terminal of said capacitor, a gate coupled to said control node, and said gate and said drain coupled together.

31. A circuit for providing a switched high-voltage signal in response to an input logic-level state, comprising:
a first pFET having a drain capacitively coupled to a first logic input node, a source coupled to a first high-voltage supply node and a gate electrically coupled to said drain of said first pFET and to a control node;
a second pFET having a source coupled to a second high-voltage supply node, a gate coupled to said control node and a drain coupled to a first node;
a third pFET having a source coupled to said first node, a gate coupled to an intermediate voltage source node and a drain coupled to an output voltage node;
a diode coupled to conduct from a second intermediate voltage-source node to said first node; and
a high-voltage nFET having a drain coupled to said output voltage node, a gate coupled to a second logic input node and a source coupled to a ground.

32. The circuit of claim 31, wherein said first logic input node and said second logic input node are electrically coupled.

33. The circuit of claim 31, wherein said first high-voltage supply node and said second high-voltage supply node are electrically coupled.

34. The circuit of claim 31, wherein said first intermediate voltage-source node and said second intermediate voltage-source node are electrically coupled.

35. The circuit of claim 31, wherein said high-voltage nFET includes a drain having an n+ region disposed in an n− well.

36. A circuit for providing a switched high-voltage signal in response to an input logic-level state, comprising:
a first pFET having a gate coupled to a bias signal node, a source coupled to a first high-voltage supply node and a drain coupled to a control node;
a second pFET having a source coupled to a second high-voltage supply node, a gate coupled to said control node and a drain coupled to a first node;
a third pFET having a source coupled to said first node, a gate coupled to an intermediate voltage-source node and a drain coupled to an output voltage node;
a diode coupled to conduct from a second intermediate voltage source node to said first node; and
a high-voltage nFET having a drain coupled to said output voltage node, a gate coupled to a logic input node and a source coupled to a ground.

37. The circuit of claim 36, wherein said first high-voltage supply node and said second high-voltage supply node are electrically coupled.

38. The circuit of claim 36, wherein said bias signal node is coupled to a bias voltage adjusted to cause said first pFET to source a current.

39. The circuit of claim 36, wherein said first intermediate voltage-source node and said second intermediate voltage-source node are electrically coupled.

40. The circuit of claim 36, wherein said high-voltage nFET includes a drain having an n+ region disposed in an n− well.

41. A circuit for providing a switched high-voltage signal in response to an input logic-level state, comprising:
a set-reset latch circuit having a set node for receiving a set logic level input, a reset node for receiving a reset logic level input, and a control node;
a first pFET having a source coupled to a first high-voltage supply node, a gate coupled to said control node and a drain coupled to a first node;
a second pFET having a source coupled to said first node, a gate coupled to a first intermediate voltage source node and a drain coupled to an output voltage node;
a first diode coupled to conduct from a second intermediate voltage source node to said first node; and
a first high-voltage nFET having a drain coupled to said output voltage node, a gate coupled to a logic input node and a source coupled to a ground.

42. The circuit of claim 41, wherein said first intermediate voltage-source node and said second intermediate voltage-source node are electrically coupled.

43. The circuit of claim 41, wherein said first high-voltage nFET includes a drain having an n+ region disposed in an n− well.

44. The circuit of claim 41, wherein said set-reset latch circuit comprises:
a second high-voltage nFET having a gate coupled to said reset node, a source coupled to a ground, and a drain coupled to a second node;
a third high-voltage nFET having a gate coupled to said set node, a source coupled to the ground and a drain coupled to a third node;
a second diode coupled to conduct from a third intermediate voltage source node to said second node, said third intermediate voltage being between said first high-voltage and the ground;
a third diode coupled to conduct from a fourth intermediate voltage source node to said third node, said fourth intermediate voltage being between said first high-voltage and the ground;
a third pFET having a source coupled to a second high-voltage supply node, a gate coupled to said third node, and a drain coupled to said second node; and
a fourth pFET having a source coupled to a third high-voltage supply node, a gate coupled to said second node, and a drain coupled to said third node and to said control node.

45. The circuit of claim 44, wherein said second high-voltage supply node and said third high-voltage supply node are electrically coupled.

46. The circuit of claim 44, wherein said first intermediate voltage-source node and said second intermediate voltage-source node are electrically coupled.

47. The circuit of claim 44, wherein said third intermediate voltage-source node and said fourth intermediate voltage-source node are electrically coupled.

48. The circuit of claim 46, wherein said first intermediate voltage-source node and said third intermediate voltage-source node are electrically coupled.

49. The circuit of claim 48, wherein said first intermediate voltage-source node and said fourth intermediate voltage-source node are electrically coupled.

50. The circuit of claim 45, wherein said first high-voltage supply node and said second high-voltage supply node are electrically coupled.

51. The circuit of claim 44, wherein said first high-voltage nFET includes a drain having an n+ region disposed in an n− well.

52. The circuit of claim 51, wherein said second high-voltage nFET includes a drain having an n+ region disposed in an n− well.

53. The circuit of claim 52, wherein said third high-voltage nFET includes a drain having an n+ region disposed in an n− well.

54. A circuit for providing a switched high-voltage signal in response to an input logic-level state, comprising:
a first pFET having a gate coupled to a bias signal node, a source coupled to a first high-voltage supply node and a drain coupled to a control node;
a second pFET having a source coupled to a second high-voltage supply node, a gate coupled to said control node and a drain coupled to a first node;
a third pFET having a source coupled to said first node, a gate coupled to a first intermediate voltage source node and a drain coupled to an output voltage node;
a first diode coupled to conduct from a second intermediate voltage source node to said first node; and
a first high-voltage nFET having a drain coupled to said output voltage node, a gate coupled to a first logic input node and a source coupled to a ground.

55. The circuit of claim 54, wherein said first intermediate voltage source node and said second intermediate voltage source node are electrically coupled.

56. The circuit of claim 54, wherein said first high-voltage supply node and said second high-voltage supply node are electrically coupled.

57. The circuit of claim 54, wherein said bias signal node is coupled to a bias voltage adjusted to cause said first pFET to source a current.

58. The circuit of claim 54, further comprising:
a third intermediate-voltage source node coupled through a second diode to said control node.

59. The circuit of claim 54, wherein said first high-voltage nFET includes a drain having an n+ region disposed in an n− well.

60. The circuit of claim 59, further comprising:
a second high-voltage nFET having a drain coupled to said control node, a gate coupled to a second logic input node and a source coupled to a ground.

61. The circuit of claim 59, wherein said second high-voltage nFET includes a drain having an n+ region disposed in an n− well.

62. A circuit for providing a switched high-voltage signal in response to an input logic level state, comprising:
a first pFET having a source coupled to a source of high-voltage, a drain coupled to an intermediate node and a gate coupled to a control node;
a second pFET having a source coupled to said intermediate node, a drain coupled to an output node and a gate coupled to a first intermediate voltage source, said first intermediate voltage source providing a voltage between said high-voltage and a ground;
a second intermediate voltage source coupled through a diode to said intermediate node, said second intermediate voltage source also providing a voltage between said high-voltage and ground; and
a high-voltage nFET having a drain coupled to said output node, a source coupled to ground and a gate coupled to a logic input node.

63. The circuit of claim 62, wherein said first intermediate voltage source and said second intermediate voltage source provide essentially the same voltage.

64. The circuit of claim 62, wherein said diode has its anode coupled to said gate of said second pFET and its cathode coupled to said intermediate node.

65. The circuit of claim 64, wherein said diode is formed from a diode-connected pFET.

66. The circuit of claim 64, wherein said diode is formed from a diode-connected nFET.

67. The circuit of claim 66, wherein said high-voltage nFET includes a drain having an n+ region disposed in an n− well.

68. A circuit for providing a switched high-voltage signal in response to an input logic-level state, comprising:
a first high-voltage nFET having a gate coupled to Vdd, a source coupled to a first logic-level input node, and a drain coupled to a control node;
a first pFET having a source coupled to a source of high-voltage, a drain coupled to an intermediate node and a gate coupled to a control node;
a second pFET having a source coupled to said intermediate node, a drain coupled to an output node and a gate coupled to a first source of an intermediate voltage intermediate said high voltage and ground;
a second source of an intermediate voltage intermediate said high-voltage and ground coupled through a diode to said intermediate node; and
a second high-voltage nFET having a drain coupled to said output node, a source coupled to ground and a gate coupled to a second logic-level input node.

69. The circuit of claim 68, wherein said diode has its anode coupled to said gate of said second pFET and its cathode coupled to said intermediate node.

70. The circuit of claim 69, wherein said diode is formed from a diode-connected pFET.

71. The circuit of claim 68, wherein said first and said second high-voltage nFETs include drains having n+ regions disposed in n− wells.

72. The circuit of claim 68, wherein said first source of an intermediate voltage and said second source of an intermediate voltage are electrically coupled.

73. The circuit of claim 68, wherein said first source of an intermediate voltage and said second source of an intermediate voltage provide essentially the same voltage.

74. A circuit for providing a switched high-voltage signal in response to an input logic-level state, comprising:
a first and a second high-voltage nFET each having a gate coupled to Vdd, each having a source coupled to a logic-level input node, one of said logic-level input nodes being an inverse of the other, and each having a drain coupled to an output node, one of said output nodes being an inverse of the other;
a first and a second pFET having their sources coupled to a source of high-voltage, and their gates and drains cross-coupled; and
an intermediate voltage stage including a third and a fourth pFET, sources of the respective third and fourth pFETs coupled to drains of the respective first and second pFETs, sources of the respective third and fourth pFETs coupled through respective first and second diodes to respective first and second intermediate voltage nodes, gates of said respective third and fourth pFETs coupled respectively to said first and second intermediate voltage nodes, and drains of said respective third and fourth pFETs coupled respectively to drains of said first and second high-voltage nFETs.

75. The circuit of claim 74, wherein said first and said second high-voltage nFETs include drains having n+ regions disposed in n− wells.

76. The circuit of claim 74, wherein said first and second intermediate voltages are substantially the same voltage.

77. A circuit for providing a differential switched high-voltage signal in response to a pair of complementary Reset-Set input logic-level signals, comprising:
a first and a second pFET each having a source, drain, well and gate terminal, the source and well of each coupled to a high-voltage supply, the drain of the second pFET coupled to a first intermediate node and its gate coupled to a second intermediate node, the drain of the first pFET coupled to the second intermediate node and its gate coupled to the first intermediate node;
a first circuit portion responsive to the Set signal and a Preset signal coupled to the first intermediate node to enable assertion of the Set signal to the first intermediate node when the Preset signal is asserted;
a second circuit portion responsive to the Reset signal and the Preset signal coupled to the second intermediate node to enable assertion of the Reset signal to the second intermediate node when the Preset signal is asserted;
a third and fourth pFET, said third pFET having its source coupled to the first intermediate node, its drain coupled to a first of two complementary switched voltage output nodes and its gate coupled to an intermediate-voltage supply, and said fourth pFET having its source coupled to the second intermediate node, its drain coupled to the second of two complementary switched voltage output nodes and its gate coupled to the intermediate-voltage supply; and
a first and a second high-voltage circuit portion, said first high-voltage circuit portion coupling the first of two complementary switched voltage output nodes to a ground through a circuit element responsive to the Reset signal, said second high-voltage circuit portion coupling the second of two complementary switched voltage output nodes to the ground through a circuit element responsive to the Set signal.

78. The circuit of claim 77, further comprising a first diode coupled between said first intermediate node and a ground.

79. The circuit of claim 78, further comprising a second diode coupled between said second intermediate node and a ground.

80. The circuit of claim 79, wherein said first and second diodes are n-well diodes having their respective anodes coupled to the ground and their respective cathodes coupled to said first intermediate node and said second intermediate node, respectively.

81. The circuit of claim 77, further comprising:
a first and a second n– well diode, said first n– well diode having an anode coupled to a ground and a cathode coupled to the first intermediate node, said second n– well diode having an anode coupled to the ground and a cathode coupled to the second intermediate node.

82. The circuit of claim 77, wherein said first and second high-voltage circuit portion comprise:
a first and a second high-voltage nFET, said first high-voltage nFET having its drain coupled to the first of two complementary switched voltage output nodes, its gate coupled to a Vdd supply, and its source coupled to the ground through a first transistor responsive to the Reset signal, said second high-voltage nFET having its drain coupled to the second of two complementary switched voltage output nodes, its gate coupled to the Vdd supply, and its source coupled to ground through a second transistor responsive to the Set signal.

83. The circuit of claim 77, wherein said first circuit portion comprises a high-voltage nFET having its drain coupled to the first intermediate node, its gate coupled to the Vdd supply and its source coupled to the source of the Set signal through a transistor responsive to the Preset signal.

84. The circuit of claim 83, wherein said second circuit portion comprises a high-voltage nFET having its drain coupled to the second intermediate node, its gate coupled to the Vdd supply and its source coupled to the source of the Reset signal through a transistor responsive to the Preset signal.

85. The circuit of claim 84, wherein the transistor responsive to the Set signal is an nFET and the source of the Preset signal is coupled to its gate and the source of the Set signal is coupled to its source.

86. The circuit of claim 85, wherein the transistor responsive to the Reset signal is an nFET and the source of the Preset signal is coupled to its gate and the source of the Reset signal is coupled to its source.

87. The circuit of claim 79, wherein said first transistor is an nFET having its drain coupled to the source of the first high-voltage nFET, its gate coupled to a source of the Reset signal and its drain coupled to the ground.

88. The circuit of claim 87, wherein said second transistor is an nFET having its drain coupled to the source of the second high-voltage nFET, its gate coupled to a source of the Set signal and its drain coupled to the ground.

89. The circuit of claim 77, wherein the intermediate-voltage is set to a level between Vdd and the high-voltage supply.

90. A circuit for providing a differential switched high-voltage signal in response to a pair of complementary Reset-Set input logic-level signals, comprising:

a first and a second pFET each having a source, drain, well and gate terminal, the source and well of each coupled to a high-voltage supply, the drain of the first pFET coupled to a first intermediate node and its gate coupled to a second intermediate node, the drain of the second pFET coupled to the second intermediate node and its gate coupled to the first intermediate node;

a third and fourth pFET, said third pFET having its source coupled to the first intermediate node, its drain coupled to a first of two complementary switched voltage output nodes and its gate coupled to an intermediate-voltage supply, and said fourth pFET having its source coupled to the second intermediate node, its drain coupled to the second of two complementary switched voltage output nodes and its gate coupled to the intermediate-voltage supply;

a first and a second high-voltage circuit portion, said first high-voltage circuit portion coupling the first of the two complementary switched voltage output nodes to a ground through a circuit element responsive to the Reset signal, said second high-voltage circuit portion coupling the second of two complementary switched voltage output nodes to the ground through a circuit element responsive to the Set signal;

a first diode having an anode coupled to said intermediate-voltage supply and a cathode coupled to said first intermediate node; and a second diode having an anode coupled to said intermediate-voltage supply and a cathode coupled to said second intermediate node.

91. The circuit of claim 90, wherein said first and second high-voltage circuit portion comprise:
a first and a second high-voltage nFET, said first high-voltage nFET having its drain coupled to the first of two complementary switched voltage output nodes, its gate coupled to a Vdd supply, and its source coupled to the ground through a first transistor responsive to the Reset signal, said second high-voltage nFET having its drain coupled to the second of two complementary switched voltage output nodes, its gate coupled to the Vdd supply, and its source coupled to ground through a second transistor responsive to the Set signal.

92. The circuit of claim 90, further comprising:
a fifth pFET and sixth pFET, said fifth pFET having its source and well coupled to the drain of said third pFET, its gate coupled to said intermediate-voltage supply and its drain coupled to the first of two complementary switched voltage output nodes, said sixth pFET having its source and well coupled to the drain of said fourth pFET, its gate coupled to said intermediate-voltage supply and its drain coupled to the second of two complementary switched voltage output nodes.

93. The circuit of claim 92, further comprising:
a third diode having an anode coupled to said intermediate-voltage supply and a cathode coupled to said source of said fifth pFET; and
a fourth diode having an anode coupled to said intermediate-voltage supply and a cathode coupled to said source of said sixth pFET.

94. The circuit of claim 93, wherein said first and second high-voltage circuit portion comprise:
a first and a second high-voltage nFET, said first high-voltage nFET having its drain coupled to the first of two complementary switched voltage output nodes, its gate coupled to a Vdd supply, and its source coupled to the ground through a first transistor responsive to the Reset signal, said second high-voltage nFET having its drain coupled to the second of two complementary switched voltage output nodes, its gate coupled to the Vdd supply, and its source coupled to ground through a second transistor responsive to the Set signal.

95. A circuit for providing a differential switched high-voltage signal in response to a pair of complementary Reset-Set input logic-level signals, comprising:

a first and a second pFET each having a source, drain, well and gate terminal, the source and well of each coupled to a high-voltage supply, the drain of the first pFET coupled to a first intermediate node and its gate coupled to a second intermediate node, the drain of the second pFET coupled to the second intermediate node and its gate coupled to the first intermediate node;

a first and a second n– well diode, said first n– well diode having an anode coupled to a ground and a cathode coupled to the first intermediate node, said second n– well diode having an anode coupled to the ground and a cathode coupled to the second intermediate node;

a third and fourth pFET, said third pFET having its source coupled to the first intermediate node, its well coupled to the high-voltage supply, its drain coupled to a first of two complementary switched voltage output nodes and its gate coupled to an intermediate-voltage supply, and said fourth pFET having its source coupled to the second intermediate node, its well coupled to the high-voltage supply, its drain coupled to the second of two complementary switched voltage output nodes and its gate coupled to the intermediate-voltage supply; and a first and a second high-voltage circuit portion, said first high-voltage circuit portion coupling the first of two complementary switched voltage output nodes to a ground through a circuit element responsive to the Reset signal, said second high-voltage circuit portion coupling the second of two complementary switched voltage output nodes to the ground through a circuit element responsive to the Set signal.

96. The circuit of claim 95, wherein said first and second high-voltage circuit portion comprise:

a first and a second high-voltage nFET, said first high-voltage nFET having its drain coupled to the first of two complementary switched voltage output nodes, its gate coupled to a Vdd supply, and its source coupled to the ground through a first transistor responsive to the Reset signal, said second high-voltage nFET having its drain coupled to the second of two complementary switched voltage output nodes, its gate coupled to the Vdd supply, and its source coupled to ground through a second transistor responsive to the Set signal.

97. The circuit of claim 95, further comprising:

a first diode having an anode coupled to said intermediate-voltage supply and a cathode coupled to said drain of aid third pFET; and a second diode having an anode coupled to said intermediate-voltage supply and a cathode coupled to said drain of said fourth pFET.

98. The circuit of claim 97, further comprising:

a fifth pFET and sixth pFET, said fifth pFET having its source and well coupled to the drain of said third pFET, its gate coupled to said intermediate-voltage supply and its drain coupled to the first of two complementary switched voltage output nodes, said sixth pFET having its source and well coupled to the drain of said fourth pFET, its gate coupled to said intermediate-voltage supply and its drain coupled to the second of two complementary switched voltage output nodes.

99. The circuit of claim 98, wherein said first and second high-voltage circuit portion comprise:

a first and a second high-voltage nFET, said first high-voltage nFET having its drain coupled to the first of two complementary switched voltage output nodes, its gate coupled to a Vdd supply, and its source coupled to the ground through a first transistor responsive to the Reset signal, said second high-voltage nFET having its drain coupled to the second of two complementary switched voltage output nodes, its gate coupled to the Vdd supply, and its source coupled to ground through a second transistor responsive to the Set signal.

* * * * *